(12) United States Patent
Chai et al.

(10) Patent No.: US 9,007,817 B2
(45) Date of Patent: Apr. 14, 2015

(54) PRE-CHARGING BITLINES IN A STATIC RANDOM ACCESS MEMORY (SRAM) PRIOR TO DATA ACCESS FOR REDUCING LEAKAGE POWER, AND RELATED SYSTEMS AND METHODS

(71) Applicant: QUALCOMM Incorporated, San Diego, CA (US)

(72) Inventors: Chiaming Chai, Cary, NC (US); Shaoping Ge, Cary, NC (US); Stephen Edward Liles, Apex, NC (US); Kunal Garg, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/049,312

(22) Filed: Oct. 9, 2013

(65) Prior Publication Data
US 2014/0328113 A1 Nov. 6, 2014

Related U.S. Application Data

(60) Provisional application No. 61/819,744, filed on May 6, 2013.

(51) Int. Cl.
*G11C 11/00* (2006.01)
*G11C 11/413* (2006.01)
(Continued)

(52) U.S. Cl.
CPC ............... *G11C 11/413* (2013.01); *G11C 7/12* (2013.01); *G11C 11/412* (2013.01); *G11C 7/1042* (2013.01); *G11C 11/419* (2013.01)

(58) Field of Classification Search
CPC ........ G11C 7/22; G11C 11/4093; G11C 8/12; G11C 11/413; G11C 11/419; G11C 7/1048; G11C 7/1075; G11C 8/16; G11C 7/12

USPC ......................... 365/154, 203, 230.05, 230.01
See application file for complete search history.

(56) References Cited

U.S. PATENT DOCUMENTS 5,841,712 A 11/1998 Wendell et al.
6,192,486 B1 2/2001 Correale, Jr. et al.
(Continued)

FOREIGN PATENT DOCUMENTS

GB 2165378 A 4/1986

OTHER PUBLICATIONS

Co-pending U.S. Appl. No. 14/017,760, filed Sep. 4, 2013.
(Continued)

*Primary Examiner* — David Lam
(74) *Attorney, Agent, or Firm* — Withrow & Terranova, PLLC

(57) ABSTRACT

Embodiments disclosed herein include methods and apparatuses for pre-charging bitlines in a static random access memory (SRAM) prior to data access for reducing leakage power. The memory access logic circuit receives a memory access request comprising a data entry address to be accessed in a first data access path of a SRAM data array of the SRAM. The SRAM also includes a pre-charge circuit provided in a second data access path outside the first data access path. The pre-charge circuit is configured to enable pre-charging of the SRAM data array as part of the memory access request to avoid pre-charging bitlines in the SRAM data array during idle periods to reduce leakage power. The pre-charge circuit can enable pre-charging of the SRAM data array prior to data access such that the pre-charge circuit does not add latency to the first data access path.

30 Claims, 13 Drawing Sheets

(51) Int. Cl.
  *G11C 7/12* (2006.01)
  *G11C 11/412* (2006.01)
  *G11C 11/419* (2006.01)
  *G11C 7/10* (2006.01)

(56) References Cited

U.S. PATENT DOCUMENTS

| | | | |
|---|---|---|---|
| 6,324,103 B2 | 11/2001 | Hiraki et al. | |
| 6,944,072 B2 | 9/2005 | Micheloni et al. | |
| 7,289,364 B2 | 10/2007 | Zanardi | |
| 7,379,359 B2 | 5/2008 | Sakakibara | |
| 8,228,749 B2 * | 7/2012 | Deng et al. | 365/154 |
| 8,279,687 B2 | 10/2012 | Adams et al. | |
| 8,339,892 B2 | 12/2012 | Kishibe | |
| 8,351,287 B1 | 1/2013 | Sood et al. | |
| 2009/0067271 A1 | 3/2009 | Yamaguchi et al. | |
| 2010/0232202 A1 | 9/2010 | Lu et al. | |
| 2012/0213023 A1 | 8/2012 | Dawson et al. | |
| 2013/0021864 A1 | 1/2013 | Deng et al. | |

OTHER PUBLICATIONS

International Search Report and Written Opinion for PCT/US2014/036517, mailed Sep. 16, 2014, 11 pages.
International Search Report and Written Opinion for PCT/US2014/036936, mailed Sep. 19, 2014, 11 pages.

* cited by examiner

US 9,007,817 B2

PRE-CHARGING BITLINES IN A STATIC RANDOM ACCESS MEMORY (SRAM) PRIOR TO DATA ACCESS FOR REDUCING LEAKAGE POWER, AND RELATED SYSTEMS AND METHODS

PRIORITY CLAIM

The present application claims priority to U.S. Provisional Patent Application Ser. No. 61/819,744 filed on May 6, 2013 and entitled "METHODS AND APPARATUSES FOR PRE-CHARGING OF STATIC RANDOM ACCESS MEMORY (SRAM) DATA ARRAYS PRIOR TO ACCESS FOR SAVING POWER LEAKAGE," which is incorporated herein by reference in its entirety.

BACKGROUND

I. Field of the Disclosure

The technology of the disclosure relates generally to computer memory, and more specifically to pre-charging bitlines of static random access memory (SRAM) for memory accesses.

II. Background

A memory cell is a basic building block of computer data storage, also known as "memory." A computer system may either read data from or write data to memory, of which there are different types. For example, one type of memory is static random access memory (SRAM). As an example, SRAM may be used as cache memory in a central processing unit (CPU) system. A SRAM cache may be comprised of a tag array and a data array. The tag array contains indexes to memory addresses stored in a SRAM data array. The tag array receives a memory address as part of a memory access request from a CPU. The tag array uses the memory address to determine if the SRAM data array contains valid data for the memory address in the memory access request. If valid data exists, the data can be directly accessed from the SRAM data array as opposed to being accessed from a higher level memory, such as a higher level cache memory or main memory.

SRAM data arrays are organized in rows and columns of SRAM bitcells. The SRAM bitcells are each capable of storing a single bit of information. A memory access request to a SRAM data array typically involves selecting an entire row of SRAM bitcells to access bits stored in each column of the selected row. In this regard, FIG. 1 illustrates an example of a standard six transistor (6-T) SRAM bitcell 10 as a SRAM cell that may be provided in a SRAM to store a single bit of information 12. The single bit of information 12 is stored in two (2) cross-coupled inverters 14, 16 in the 6-T SRAM bitcell 10. The 6-T SRAM bitcell 10 has two stable states that are used to indicate the single bit of information 12 (e.g., logical state "1" or "0"). Two additional access transistors 18, 20 are provided to control access to the SRAM bitcell 10 during read and write operations. Access to the 6-T SRAM bitcell 10 is enabled by a wordline signal 22 asserted on a wordline 24 that controls the two (2) access transistors 18, 20. The assertion of the wordline signal 22 on the wordline 24 activates the two (2) access transistors 18, 20 causing the bitline 26 and the bitline complement 28 to be coupled to the two (2) cross-coupled inverters 14, 16. Thus, the bitline 26 and the bitline complement 28 are used to transfer data for both read and write operations.

As an example, in a read operation, activation of the access transistors 18, 20 causes the single bit of information 12 to be placed on the bitline 26 and the bitline complement 28 by the two (2) cross-coupled inverters 14, 16. The single bit of information 12 is placed on the bitline 26 and the bitline complement 28 in the form of voltage or current levels. A sense amplifier 30 detects the voltage differential between the bitline 26 and the bitline complement 28 indicating one of two logical states, as discussed above. In a write operation, an input driver 32 places a voltage 34 and a voltage complement 36 on the bitline 26 and the bitline complement 28, respectively. The voltage 34 and the voltage complement 36 placed on the bitline 26 and the bitline complement 28, respectively, by the input driver 32 represent the single bit of information 12 to be stored. Activation of the access transistors 18, 20 by the wordline 24 causes the voltage 34 and the voltage complement 36 on the bitline 26 and the bitline complement 28 to be stored or latched into the two (2) cross-coupled inverters 14, 16.

The bitline 26 and the bitline complement 28 in the 6-T SRAM bitcell 10 in FIG. 1 may be pre-charged by a bitline pre-charge signal 38 and a bitline pre-charge signal complement 40, respectively to a known, stable voltage level (i.e. logical high "1" or logical low "0") prior to a read or write access. Pre-charging the bitline 26 and the bitline complement 28 allows the sense amplifier 30 to efficiently interpret differential voltage levels as a bit state, and allows the SRAM bitcell 10 to start from a known condition in order to prevent cell disturbances of the SRAM bitcell 10. The pre-charging of the bitline 26 and the bitline complement 28 is deactivated upon assertion of the wordline 24, thus allowing the initial known voltage level to be modified by the two (2) cross-coupled inverters 14, 16 or by the input driver 32, as described above in the read or write operations. After the read or write operation to the 6-T SRAM bitcell 10 has been completed for a memory access request, the bitline 26 and the bitline complement 28 can be pre-charged back to this known pre-charge voltage level to prepare for a next memory access request.

As discussed above, for SRAM designs that employ pre-charging of the bitlines of a SRAM bitcell column, a memory address in a memory access request can be used to identify a particular row or column of SRAM bitcells being accessed for pre-charging. The memory access request employs a memory access request circuit to translate the memory address in the memory access request to the particular row or column being accessed for pre-charging. However, providing this additional circuitry may add latency to the memory access request. To avoid this additional latency, SRAM designs may involve pre-charging all row or columns of the SRAM bitcells after the read or write operation has been completed to prepare the SRAM bitcells for the next memory access request. Thus, additional circuitry for translating the memory address in the memory access request to the particular row or column of SRAM bitcells is not necessary. However, maintaining a bitline pre-charge may increase leakage power during memory idle times when the SRAM bitcells are not being accessed.

Thus, SRAM designs that involve pre-charging all row or columns of the SRAM bitcells can consume more power than SRAM designs that identify the particular row or columns of the SRAM bitcells as part of the memory access request. However, SRAM designs that involve pre-charging all row or columns of the SRAM bitcells may not include additional latency from circuitry used to identify the particular row or column being accessed as part of the memory access request for pre-charging.

SUMMARY OF THE DISCLOSURE

Embodiments disclosed herein include methods and apparatuses for pre-charging bitlines in a static random access memory (SRAM) prior to data access for reducing leakage power. The embodiments for pre-charging a SRAM prior to data access may reduce leakage power without impacting read or write performance. The SRAM may be included in a SRAM cache, as one non-limiting example. In this regard, a memory access logic circuit is provided in a first data access path in the SRAM. The memory access logic circuit receives a memory access request comprising a data entry address to be accessed in a SRAM data array of the SRAM. The memory access logic circuit translates the data entry address into a data index for indexing the data entry address in the SRAM data array. The SRAM also includes a pre-charge circuit provided in a second data access path outside the first data access path. The pre-charge circuit is configured to enable pre-charging of the SRAM data array as part of the memory access request to avoid pre-charging bitlines in the SRAM data array during idle periods to reduce leakage power. But, by also providing the pre-charge circuit in the second data access path outside the first data access path, the pre-charge circuit can enable pre-charging of the SRAM data array prior to data access such that the pre-charge circuit does not add latency to the first data access path.

To further reduce leakage power, if the SRAM data array is organized into sub-arrays for example, the pre-charge circuit can also be configured to identify and enable pre-charging of the particular data sub-array in the SRAM data array that contains the data entry address. In this manner, the data sub-arrays in the SRAM data array that do not contain the data entry address are not enabled for pre-charging during the memory access request to avoid additional leakage power by not pre-charging in the non-accessed data sub-arrays.

In this regard, in one embodiment a SRAM is provided. The SRAM comprises a memory access logic circuit provided in a first data access path. The memory access logic circuit is configured to receive a data entry address of a memory access request for addressing a data entry in a SRAM data array in the first data access path. The memory access logic circuit is further configured to generate a data index based on the received data entry address in the first data access path to index the SRAM data array for accessing the data entry in the SRAM data array corresponding to the received data entry address. The SRAM further comprises a pre-charge circuit provided in a second data access path separate from the first data access path. Prior to accessing the data entry in the SRAM data array, the pre-charge circuit is configured to receive the data entry address in the second data access path. The pre-charge circuit is further configured to generate a pre-charge enable to at least a portion of the SRAM data array based on the received data entry address in the second data access path to pre-charge the at least a portion of the SRAM data array.

In another embodiment, a SRAM is provided. The SRAM comprises a memory access logic circuit means provided in a first data access path means. The memory access logic circuit means is configured to receive a data entry address means for a memory access request means for addressing a data entry means in a SRAM data array means in the first data access path means. The memory access logic circuit means is further configured to generate a data index means based on the received data entry address means in the first data access path means to index the SRAM data array means for accessing the data entry means in the SRAM data array means corresponding to the data entry address means. The SRAM further comprises a pre-charge circuit means provided in a second data access path means separate from the first data access path means. Prior to accessing the data entry means in the SRAM data array means, the pre-charge circuit means is configured to receive the data entry address means in the second data access path means. The pre-charge circuit means is further configured to generate a pre-charge enable means to at least a portion of the SRAM data array means based on the received data entry address means in the second data access path means to pre-charge the at least a portion of the SRAM data array means.

In another embodiment, a method of pre-charging SRAM data array prior to accessing the SRAM data array is provided. The method comprises receiving a data entry address in a first data access path for a memory access request for addressing a data entry in a SRAM data array. The method further comprises generating a data index based on the received data entry address in the first data access path to index the SRAM data array for accessing the data entry in the SRAM data array corresponding to the data entry address. The method further comprises receiving a data entry address in a second data access path for pre-charging at least a portion of the SRAM data array. The method further comprises generating a pre-charge enable for the at least a portion of the SRAM data array based on the received data entry address in the second data access path to pre-charge the at least a portion of the SRAM data array. The pre-charge enable is generated prior to accessing the data entry in the SRAM data array in the first data access path at the data index representative of the data entry address.

DETAILED DESCRIPTION

Embodiments disclosed herein include methods and apparatuses for pre-charging bitlines in a static random access memory (SRAM) prior to data access for reducing leakage power. The embodiments for pre-charging a SRAM prior to data access may reduce leakage power without impacting read or write performance. The SRAM may be included in a SRAM cache, as one non-limiting example. In this regard, a memory access logic circuit is provided in a first data access path in the SRAM. The memory access logic circuit receives a memory access request comprising a data entry address to be accessed in a SRAM data array of the SRAM. The memory access logic circuit translates the data entry address into an index for indexing the data entry address in the SRAM data array. The SRAM also includes a pre-charge circuit provided in a second data access path outside the first data access path. The pre-charge circuit is configured to enable pre-charging of the SRAM data array as part of the memory access request to avoid pre-charging bitlines in the SRAM data array during idle periods to reduce leakage power. But, by also providing the pre-charge circuit in the second data access path outside the first data access path, the pre-charge circuit can enable pre-charging of the SRAM data array prior to data access such that the pre-charge circuit does not add latency to the first data access path.

To further reduce leakage power, if the SRAM data array is organized into sub-arrays for example, the pre-charge circuit can also be configured to identify and enable pre-charging of the particular data sub-array in the SRAM data array that contains the data entry address. In this manner, the data sub-arrays in the SRAM data array that do not contain the data entry address are not enabled for pre-charging during the memory access request to avoid additional leakage power by not pre-charging in the non-accessed data sub-arrays.

Figure 1:
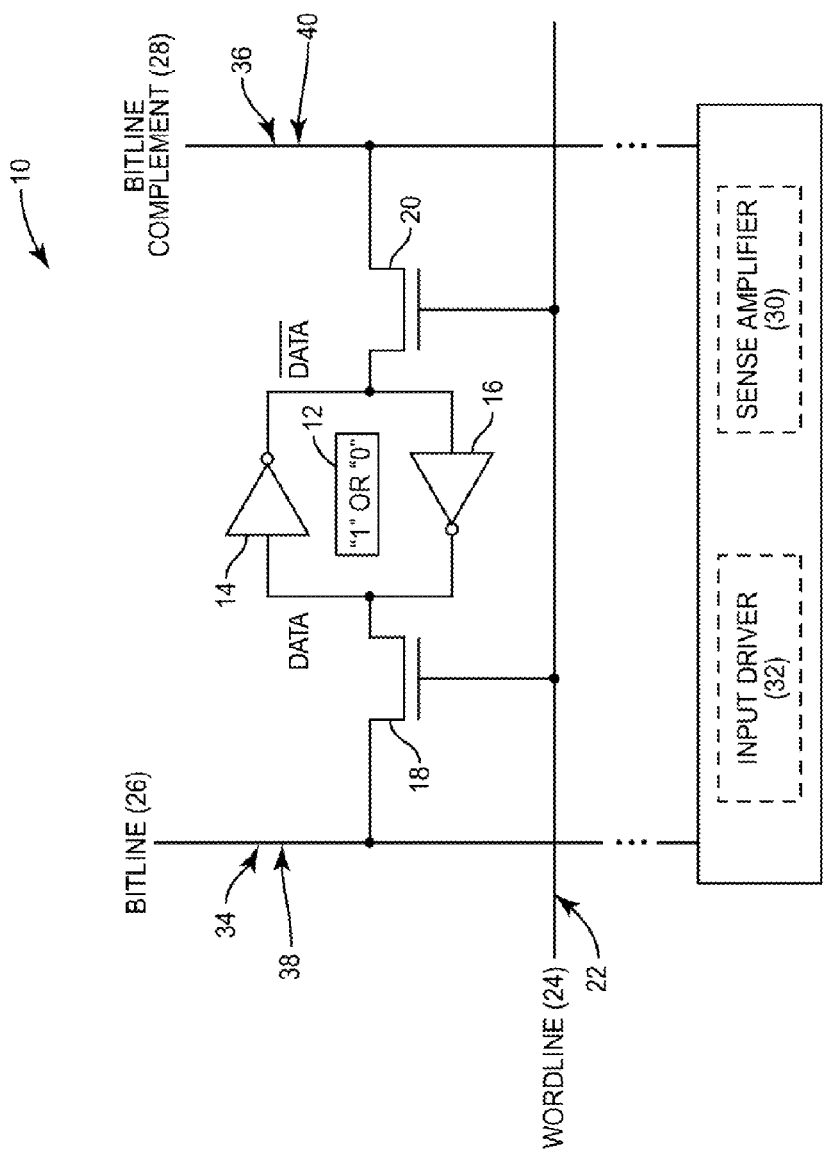
FIG. 1 is a schematic diagram of an exemplary six transistor (6-T) static random access memory (SRAM) memory cell for storing a single bit of information.
Figure 2:
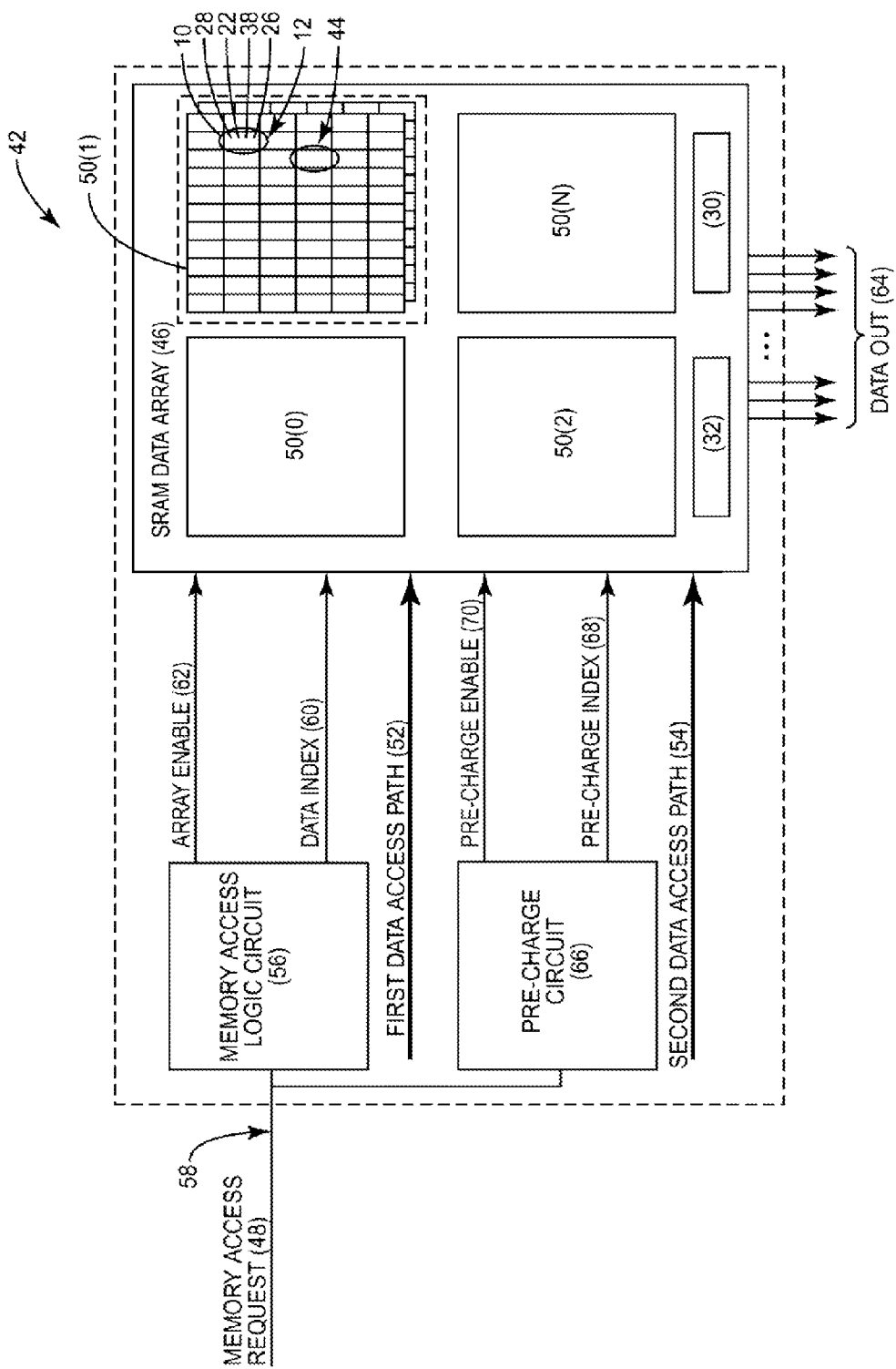
FIG. 2 is a schematic diagram of an exemplary SRAM comprising a memory access logic circuit for indexing a data entry in a SRAM data array for a memory access request, and a pre-charge circuit for pre-charging bitlines in the SRAM data array prior to accessing the data entry in the SRAM data array for the memory access request in order to reduce or avoid latency in processing the memory access request.

In this regard, FIG. 2 is a schematic diagram of an exemplary SRAM 42 for indexing a data entry 44 in a SRAM data array 46 for a memory access request 48. As will be discussed below, the SRAM data array 46 is pre-charged prior to access to the data entry 44 in the SRAM data array 46 for the memory access request 48. The SRAM data array 46 is organized in rows and columns of the 6-T SRAM bitcell 10 provided in FIG. 1 in this example. The SRAM bitcell 10 of FIG. 1 is referenced in describing FIG. 2 and will not be re-described. The SRAM data array 46 may be further organized into a plurality of SRAM data sub-arrays 50(0)-50(N).

With continuing reference to FIG. 2, the SRAM 42 comprises two (2) data access paths, a first data access path 52 and a second data access path 54, as a non-limiting example. The first data access path 52 processes the memory access request 48 to generate an index for the SRAM data array 46 for access to the data entry 44 corresponding to the memory access request 48. In this non-limiting example, the second data access path 54 processes the memory access request 48 to identify a particular one of the plurality of SRAM data sub-arrays 50(0)-50(N) to be accessed so that only the particular SRAM data sub-array 50(0)-50(N) to be accessed requires pre-charging to reduce leakage power. In this example, the pre-charging of the particular SRAM data sub-array 50(0)-50(N) occurs in the second data access path 54 outside of the first data access path 52 prior to accessing the data entry 44 in the first data access path 52 so that latency of the pre-charging is not provided as part of the first data access path 52 for accessing the data entry 44 in the SRAM data array 46. Additionally, the SRAM 42 can pre-charge the particular data entry 44 in the SRAM data array 46 being accessed, also reducing leakage power in the SRAM 42 by not pre-charging the data entries 44 or the SRAM data sub-arrays 50(0)-50(N) not being accessed. The first data access path 52 in the SRAM 42 in FIG. 2 will now be described.

With reference to FIG. 2, a memory access logic circuit 56 is provided in the first data access path 52 and configured to process the received memory access request 48. Processing of the memory access request 48 may comprise receiving the memory access request 48 and translating the data entry address 58 in the memory access request 48 into a data index 60 for indexing the data entry 44 in the SRAM data array 46. The data index 60 is generated by translating a data entry address 58 in the memory access request 48 into an index corresponding to the data entry 44 location in the SRAM data array 46. In this example, the data index 60 provides an index for indexing the data entry 44 in the SRAM data sub-arrays 50(0)-50(N) of the SRAM data array 46 containing the data at the data entry address 58. Accessing the data entry 44 includes asserting an array enable 62 to the SRAM data array 46 to initiate an access event in the SRAM data array 46 based on the memory access request 48. The SRAM data array 46 additionally receives, as input, the array enable 62. The array enable 62 indicates that there has been a corresponding data index 60 output on the data index 60. Further, the assertion of the array enable 62 initiates the accessing of the data entry 44 in the first data access path 52. Based on the asserted array enable 62, the SRAM data array 46 outputs the addressed data entry 44 as a data out 64 from the SRAM data array 46. The pre-charging is provided for by identifying the SRAM data sub-arrays 50(0)-50(N) in the second data access path 54 based on the memory access request 48. Additionally, pre-charging is not provided for in the first data access path 52 as will be discussed below.

With continuing reference to FIG. 2, and as introduced above, the second data access path 54 in the SRAM 42 includes components to identify a particular one or more of the plurality of SRAM data sub-arrays 50(0)-50(N) to pre-charge outside of the first data access path 52 prior to accessing the data entry 44 in the first data access path 52. Pre-charging is provided for in the second data access path 54 outside of the first data access path 52, and thus, latency due to pre-charging is not provided as part of the first data access path 52 used for accessing the data entry 44 in the SRAM data array 46. The second data access path 54 will now be described.

With continued reference to FIG. 2, the second data access path 54 comprises a pre-charge circuit 66. The pre-charge circuit 66 is configured to enable pre-charging of the SRAM data array 46 on one or more of the plurality of SRAM data sub-arrays 50(0)-50(N) in the second data access path 54. The pre-charge circuit 66 is also configured to receive the memory access request 48 in the second data access path 54. The pre-charge circuit 66 is further configured to generate a pre-charge index 68 for indexing the SRAM data sub-arrays 50(0)-50(N) being accessed that correspond to the memory access request 48. The pre-charge circuit 66 generates the pre-charge index 68 by translating the received memory access request 48 into the pre-charge index 68 corresponding to the SRAM data sub-arrays 50(0)-50(N). The pre-charge index 68 indicates which of the SRAM data sub-arrays 50(0)-50(N) requires pre-charging. The pre-charge circuit 66 is further configured to generate a pre-charge enable 70 which, in this example, enables the pre-charging of the SRAM data sub-arrays 50(0)-50(N) by the SRAM data array 46.

With continued reference to FIG. 2, the pre-charge enable 70 indicates to the SRAM data array 46 that the pre-charge index 68 has been provided to the SRAM data array 46. The generated pre-charge index 68 and the pre-charge enable 70 are received by the SRAM data array 46 in the second data access path 54 prior to accessing the data entry 44 in the first data access path 52. The SRAM data array 46 can proceed with the pre-charging of the SRAM data sub-arrays 50(0)-50(N) indicated by the pre-charge index 68 following receipt of the pre-charge enable 70 without waiting for the processing of the memory access request 48 to be completed in the first data access path 52. As a non-limiting example, enabling the pre-charging of the SRAM data sub-arrays 50(0)-50(N) involves pre-charging only the bitlines 26 and the bitline complements 28 shown in FIG. 1 of the SRAM data sub-arrays 50(0)-50(N) containing the data entry 44 being accessed. This is possible because the memory access request 48 is provided in the second data access path 54 and the pre-charge circuit 66 can be used to identify the particular SRAM data sub-array 50(0)-50(N) to enable the pre-charge. The bitlines 26 and the bitline complements 28 of the SRAM data sub-arrays 50(0)-50(N) not being accessed can be placed in or can remain in a floating state. A floating state is a state in which the bitlines 26 and the bitline complements 28 of the SRAM data sub-arrays 50(0)-50(N) not being accessed are not pre-charged or maintained in either a logic high or logic low state.

With continuing reference to FIG. 2, leakage power can occur during memory idle periods during which the bitlines 26 and the bitline complements 28 of the SRAM data sub-arrays 50(0)-50(N) not being accessed are pre-charged in either a logic high or logic low state. The pre-charge circuit 66 is configured to enable pre-charging of the SRAM data array 42 as part of the memory access request 48 to avoid pre-charging bitlines 26 28 in the SRAM data array 46 during idle periods to reduce leakage power. But, by also providing the pre-charge circuit 66 in the second data access path 54 outside the first data access path 52, the pre-charge circuit 66 can enable pre-charging of the SRAM data array 42 prior to data access such that the pre-charge circuit 66 does not add latency to the first data access path 52.

Figure 3:
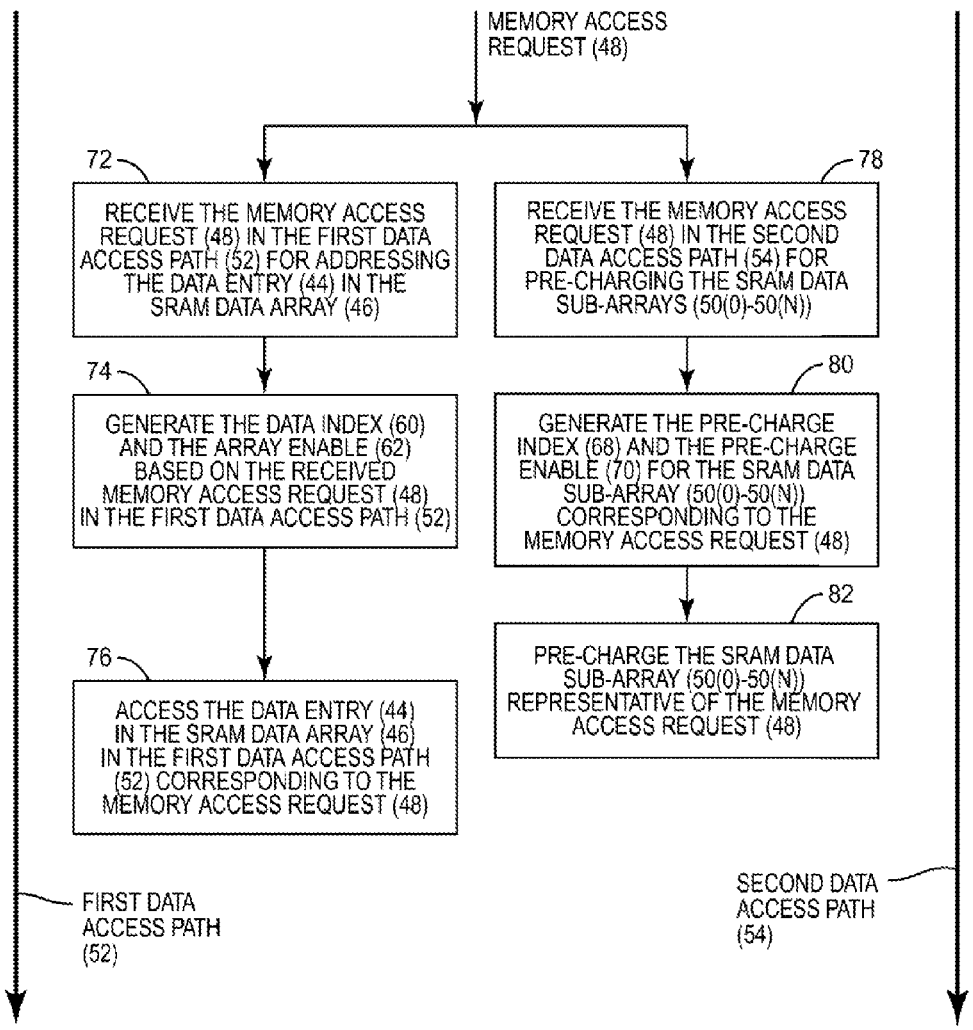
FIG. 3 is a flowchart illustrating an exemplary process for pre-charging bitlines in the SRAM data array in the SRAM in FIG. 2, prior to accessing the data entry in the SRAM data array for the memory access request.

To further explain a memory access request 48 and pre-charging bitlines 26 28 in the SRAM data array 46 prior to access of the data entry 44, FIG. 3 is provided. FIG. 3 is a flowchart illustrating an exemplary process for processing of the memory access request 48 in the SRAM 42 of FIG. 2. As discussed above, the processing of the memory access request 48 comprises two (2) data access paths, the first data access path 52 and the second data access path 54. The processing of the memory access request 48 to access the data entry 44 in the SRAM data array 46 at the data entry address 58 in the memory access request 48 comprises receiving the memory access request 48 in the first data access path 52 for addressing the data entry 44 in the SRAM data array 46 (block 72). The memory access logic circuit 56 of FIG. 2 generates the data index 60 and the array enable 62 based on the received memory access request 48 in the first data access path 52 (block 74). The memory access logic circuit 56 generates the data index 60 and the array enable 62 by translating the memory access request 48 comprising the data entry address 58. The data index 60 and the array enable 62 generated by the memory access logic circuit 56 are output to the SRAM data array 46. The SRAM data array 46 uses the data index 60 and the array enable 62 received to access the data entry 44 in the SRAM data array 46 in the first data access path 52 corresponding to the memory access request 48 (block 76).

With continuing reference to FIG. 3, the processing of the memory access request 48 of FIG. 2 further comprises receiving the memory access request 48 in the second data access path 54 for pre-charging bitlines 26 28 in the SRAM data sub-arrays 50(0)-50(N) (block 78 in FIG. 3). The pre-charge circuit 66 generates the pre-charge index 68 and the pre-charge enable 70 for the SRAM data sub-array 50(0)-50(N) corresponding to the memory access request 48 (block 80 in FIG. 3). The generated pre-charge index 68 and the pre-charge enable 70 are output by the pre-charge circuit 66 and received by the SRAM data array 46. The SRAM data array 46 uses the pre-charge index 68 and the pre-charge enable 70 received to pre-charge the SRAM data sub-array 50(0)-50(N) representative of the memory access request 48 (block 82 in FIG. 3). Thus, the SRAM data array 46 of FIG. 2 can pre-charge the SRAM data sub-array 50(0)-50(N) without waiting for the memory access logic circuit 56 to complete the translation of the memory access request 48 and access of the data entry 44 in the first data access path 52. In this manner, the SRAM data sub-array 50(0)-50(N) containing the data entry 44 corresponding to the memory access request 48 is pre-charged prior to the SRAM data array 46 accessing the data entry 44 corresponding to the memory access request 48.

With reference to FIG. 2, the pre-charging of the SRAM data array 46 is enabled in the second data access path 54 outside of the first data access path 52. In this manner, pre-charging bitlines 26 28 in the SRAM data sub-array 50(0)-50(N) containing the data entry 44 to be accessed is not dependent on data entry 44 access enabled in the first data access path 52. The pre-charge circuit 66 can enable pre-charging of the SRAM data sub-array 50(0)-50(N) containing the data entry 44 to be accessed prior to access of the data entry 44, if at least a portion of the data entry address 58 in the memory access request 48 sufficient to identify the SRAM data sub-array 50(0)-50(N) to be accessed is available. In this regard, the pre-charge circuit 66 is configured to receive at least a portion of the data entry address 58 in the memory access request 48 in the second data access path 54 sufficient to identify the SRAM data sub-array 50(0)-50(N) to be accessed. The pre-charge circuit 66 can decode the received data entry address 58, or a portion thereof, to identify the SRAM data sub-array 50(0)-50(N) in the SRAM data array 46 containing the data entry 44 to be accessed. Thus, the pre-charge circuit 66 can enable the pre-charging of the SRAM data sub-array 50(0)-50(N) determined to contain the data entry 44 independent of the first data access path 52 and prior to access of the data entry 44 in the SRAM data sub-array 50(0)-50(N).

To reduce or avoid the leakage power during memory idle times, not all the bitlines 26 and bitline complements 28 of FIG. 1 will be pre-charged. Thus, only the bitlines 26 and the bitline complements 28 of the SRAM data sub-array 50(0)-50(N) comprising the data entry 44 being accessed may be pre-charged, as opposed to all of the bitlines 26 in the SRAM data sub-arrays 50(0)-50(N), as a non-limiting example. The bitlines 26 and the bitline complements 28 of the SRAM data sub-arrays 50(0)-50(N) not being accessed as part of the memory access request 48 may be left in a floating state to further prevent leakage power. In this manner, latency of the pre-charge circuit 66 is not provided as part of the first data access path 52 for accessing the data entry 44 in the SRAM data sub-array 50. Additionally, the SRAM 42 can pre-charge the data entry 44 in the SRAM data sub-array 50 being accessed, while also reducing leakage power in the SRAM 42.

Figure 4:
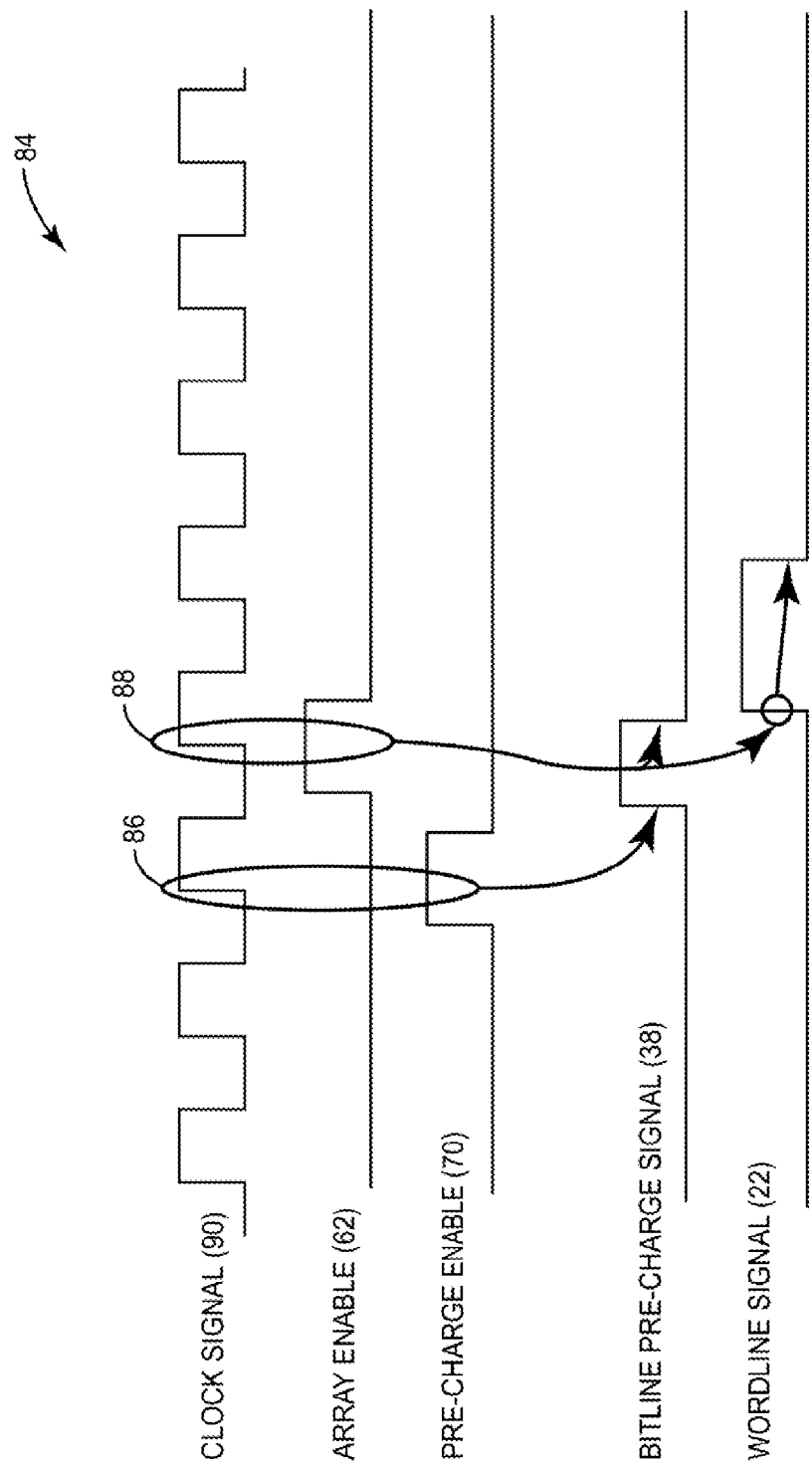
FIG. 4 is a timing diagram illustrating exemplary timing of signals involved in pre-charging bitlines in the SRAM data array in the SRAM in FIG. 2, prior to accessing the data entry in the SRAM data array for the memory access request.

In this regard, FIG. 4 illustrates a timing diagram 84 of exemplary signals involved with two (2) events, a pre-charging event 86 and an accessing event 88. FIG. 4 illustrates that the pre-charging event 86 for pre-charging bitlines 26 28 in the SRAM data array 46 in the second data access path 54 is independent of the accessing event 88 for accessing the SRAM data array 46 in the first data access path 52. The pre-charge event 86 for pre-charging the SRAM data sub-array 50(0)-50(N) occurs as a result of the pre-charge circuit 66 processing the memory access request 48 in the second data access path 54. The accessing event 88 for accessing the data entry 44 occurs as a result of the memory access logic circuit 56 processing the memory access request 48 in the first data access path 52. The exemplary signals of the two (2) events will now be described.

With continuing reference to FIG. 4, the SRAM 42 is a synchronous circuit; therefore, a clock signal 90 is provided to the SRAM 42 to control clocking of the circuits that control the memory access request 48. As previously discussed, the pre-charge circuit 66 generates the pre-charge enable 70 as shown in FIG. 4. The pre-charge enable 70 is asserted by the pre-charge circuit 66 following the generation of the pre-charge index 68 by the pre-charge circuit 66 in FIG. 2 indicating the pre-charge index 68 has been provided to the SRAM data array 46 by the pre-charge circuit 66. The assertion of the bitline pre-charge signal 38 by the SRAM data array 46 is based on a rising edge or transition (hereinafter referred to as "rising edge") of the clock signal 90 following the assertion of the pre-charge enable 70 by the pre-charge circuit 66. As illustrated in FIG. 4, the array enable 62 is not generated by the memory access logic circuit 56 based on the pre-charge enable 70. Rather, the array enable 62 is asserted by the memory access logic circuit 56 based on the generation of the data index 60 by the memory access logic circuit 56 in FIG. 2. The array enable 62 is asserted by the memory access logic circuit 56 following the generation of the data index 60 by the memory access logic circuit 56 indicating the data index 60 has been provided to the SRAM data array 46 by the memory access logic circuit 56. The assertion of the wordline signal 22 by the SRAM data array 46 is based on a rising edge of the clock signal 90 following the assertion of the array enable 62 by the memory access logic circuit 56, as a non-limiting example. The assertion of the wordline signal 22 by the SRAM data array 46 may also be based on a falling edge or transition (hereinafter referred to as "falling edge") of the clock signal 90. In addition, the pre-charge enable 70 is de-asserted by the SRAM data array 46 based on the rising edge of the clock signal 90 following the assertion of the array enable 62 by the memory access logic circuit 56. By pre-charging the SRAM data sub-array 50 in the second data access path 54, the additional latency of the pre-charge circuit 66 is not provided as part of the latency of the first data access path 52 for accessing the data entry 44 in the SRAM data sub-array 50. However, it should be noted that the SRAM 42 should be designed so that the array enable 62 is not consumed before the pre-charge enable 70 has finished pre-charging the SRAM data sub-array 50. Otherwise, the SRAM data sub-array 50 being accessed may not be pre-charged at the time of access.

A CPU cache is cache memory used by a CPU system of a computer to reduce the average time required to access memory. The CPU cache is a smaller, faster memory that stores copies of data from frequently used main memory locations. The more memory accesses that use cached memory locations, the more the average latency of memory accesses will be closer to the cache latency than to the latency of main memory. Therefore cache latency may be an important factor in the performance of the memory of the CPU. The SRAM 42 is one type of memory that may be used in a computer system as cache memory. Pre-charging in the previous clock cycle prior to all memory access signals becoming ready decreases latency of the SRAM 42 and thus, accelerates the performance of the SRAM 42 as described above.

Figure 5:
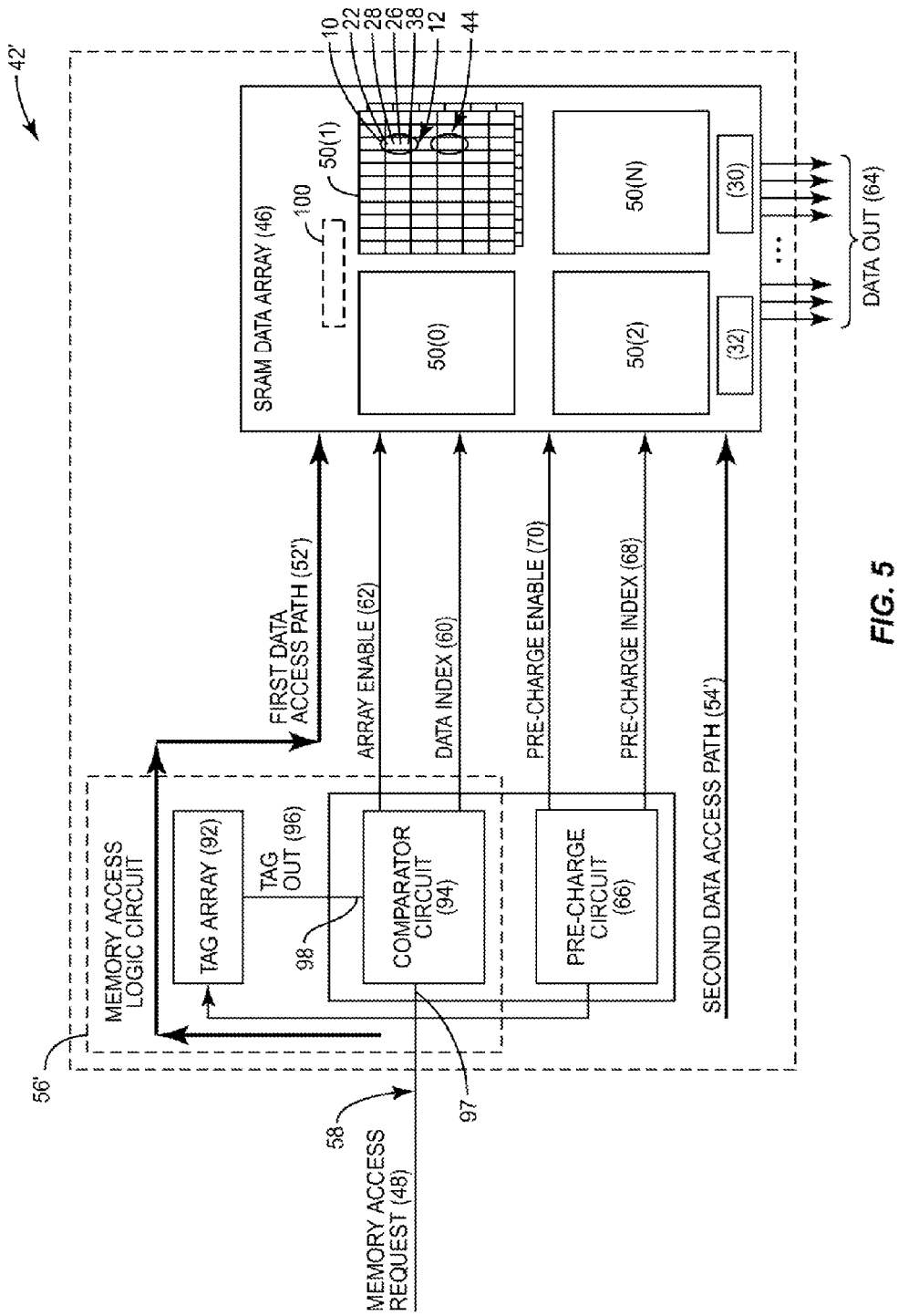
FIG. 5 is a schematic diagram of an exemplary SRAM cache comprising a tag array in a memory access logic circuit for indexing the data entry in the SRAM data array for the memory access request, and a pre-charge circuit for pre-charging bitlines in the SRAM data array, prior to accessing the data entry in the SRAM data array for the memory access request to reduce or avoid latency in processing the memory access request.

In this regard, FIG. 5 is a schematic diagram of an exemplary SRAM cache 42' for indexing the data entry 44 in the SRAM data array 46 for the memory access request 48. As will be discussed below, the SRAM data array 46 is pre-charged prior to access to the data entry 44 in the SRAM data array 46 for the memory access request 48. The SRAM data array 46 is organized in rows and columns of the 6-T SRAM bitcell 10 provided in FIG. 1 in this example. For the sake of clarity, elements of FIG. 1 referenced in describing FIG. 5 will not be re-described. The SRAM data array 46 may be further organized into a plurality of SRAM data sub-arrays 50(0)-50(N).

With continuing reference to FIG. 5, the SRAM cache 42' comprises two (2) data access paths in this example, a first data access path 52' and a second data access path 54'. The first data access path 52' provides for processing of the memory access request 48 to index the SRAM data array 46 for access to the data entry 44 corresponding to the memory access request 48. The second data access path 54' is provided to identify a particular one or more of the plurality of SRAM data sub-arrays 50(0)-50(N) to be accessed so that only the particular SRAM data sub-array 50(0)-50(N) to be accessed requires pre-charging to reduce leakage power, as a non-limiting example. In this example, the pre-charging of the SRAM data sub-array 50(0)-50(N) occurs in the second data access path 54' outside of the first data access path 52' prior to accessing the data entry 44 in the first data access path 52'. The first data access path 52' in the SRAM cache 42' in FIG. 5 will now be described.

With reference to FIG. 5, the SRAM cache 42' is further comprised of a memory access logic circuit 56' configured to process the received memory access request 48. The memory access logic circuit 56' is configured to process the memory access request 48 in the first data access path 52'. Processing of the memory access request 48 may comprise receiving the memory access request 48 and translating the data entry address 58 into the data index 60 for indexing the data entry 44 located in the SRAM data array 46 corresponding to the memory access request 48. The data index 60 is generated by translating the data entry address 58 in the memory access request 48 into an index corresponding to the data entry 44 location in the SRAM data array 46.

In this example of the SRAM cache 42', the memory access logic circuit 56' is comprised of a tag array 92 and a comparator circuit 94. The tag array 92 receives the memory access request 48 as input. The tag array 92 uses the memory access request 48 provided to check for the validity of the data entry 44 stored in the SRAM data array 46 representing the data entry address 58 in the memory access request 48. A data entry 44 that is valid contains a coherent representation of the data at the data entry address 58 with the data stored in the memory. If the data entry 44 is valid, the tag array 92 provides a tag out 96 as valid output to the comparator circuit 94. The comparator circuit 94 receives, as a first input 97, the memory access request 48 and, as a second input 98, the tag out 96. The comparator circuit 94 makes a comparison between the memory access request 48 and the tag out 96, and generates the data index 60 provided as output to the SRAM data array 46.

With continuing reference to FIG. 5, the SRAM data array 46 receives, as input, the generated data index 60. In this example, the data index 60 provides an indication of which data entry 44 in the SRAM data sub-arrays 50(0)-50(N) of the SRAM data array 46 contains data at the data entry address 58. Accessing the data entry 44 includes providing the array enable 62 to the SRAM data array 46 used to initiate memory accessing in the SRAM data array 46 based on the memory access request 48. The SRAM data array 46 additionally receives, as input, the array enable 62. The array enable 62 indicates that there has been a corresponding data index 60 output by the memory access logic circuit 56', and thus, accessing the data entry 44 may proceed. The data index 60 and the array enable 62 are output to the SRAM data array 46 for use in accessing the data entry 44 in the SRAM data array 46 in the first data access path 52'. With the array enable 62 asserted, the SRAM data array 46 outputs the addressed data entry 44 as the data out 64 from the SRAM data array 46. For the sake of clarity, elements of FIG. 1 referenced in describing FIG. 5 will not be re-described.

With continuing reference to FIG. 5, the second data access path 54' comprises the pre-charge circuit 66. The pre-charge circuit 66 is configured to enable pre-charging of the SRAM data array 46 or the SRAM data sub-arrays 50(0)-50(N) in the second data access path 54'. The pre-charge circuit 66 is configured to receive the memory access request 48. The pre-charge circuit 66 is further configured to generate the pre-charge index 68 for indexing the SRAM data sub-array 50(0)-50(N) being accessed that corresponds to the memory access request 48. The pre-charge circuit 66 generates the pre-charge index 68 by translating the received memory access request 48 into the pre-charge index 68 corresponding to the SRAM data sub-array 50(0)-50(N) to be accessed in the first data access path 52'. The pre-charge index 68 indicates which of the SRAM data sub-arrays 50(0)-50(N) requires pre-charging, the pre-charge index 68 does not need to indicate all of the index bits. Thus, only a portion of the index bits are needed in the previous clock cycle prior to memory access. The pre-charge circuit 66 is further configured to generate the pre-charge enable 70 which, in this example, enables the pre-charging of the SRAM data sub-array 50(0)-50(N) by the SRAM data array 46.

With continuing reference to FIG. 5, the pre-charge enable 70 indicates to the SRAM data array 46 that the pre-charge index 68 has been provided to the SRAM data array 46. The generated pre-charge index 68 and the pre-charge output 70 are received by the SRAM data array 46 in the second data access path 54' prior to accessing the data entry 44 in the first data access path 52'. The SRAM data array 46 can proceed with the pre-charging of the SRAM data sub-array 50(0)-50(N) indicated by the pre-charge index 68 following receipt of the pre-charge enable 70 independently of the processing of the memory access request 48 in the first data access path 52'. Additionally, the generated pre-charge index 68 may only need to comprise a portion of all index bits to proceed with the pre-charging of the SRAM data sub-arrays 50(0)-50(N), as an example. As a non-limiting example, pre-charging of the SRAM data sub-arrays 50(0)-50(N) may involve pre-charging only the bitlines 26 and the bitline complements 28 of FIG. 1 of the SRAM data sub-array 50(0)-50(N) containing the data entry 44 being accessed. The bitlines 26 and the bitline complements 28 of the SRAM data sub-arrays 50(0)-50(N) not being accessed can be placed in or can remain in a floating state, thus reducing leakage power.

With continuing reference to FIG. 5, leakage power can occur during memory idle periods in which the bitlines 26 and the bitline complements 28 of the SRAM data sub-arrays 50(0)-50(N) not being accessed are pre-charged in either a logic high or logic low state. To reduce the leakage power experienced due to the pre-charging of the bitlines 26 and the bitline complements 28 of the SRAM data array 46, only the bitlines 26 and the bitline complements 28 of the SRAM data sub-array 50 comprising the data entry 44 being accessed by the memory access request 48 are pre-charged. The bitlines 26 and the bitline complements 28 of the SRAM data sub-arrays 50(0)-50(N) not being accessed may be left in a floating state to reduce leakage power. In addition, the enabling of the pre-charging of the SRAM data sub-arrays 50(0)-50(N) in the second data access path 54' can occur while the memory access logic circuit 56' processes the memory access request 48 in the first data access path 52'. The data entry 44 in the SRAM data array 46 being accessed is pre-charged prior to access based on the pre-charge index 68 received in the second data access path 54'. In this manner, the pre-charge circuit 66 is configured to enable pre-charging of the bitlines 26 28 in the SRAM data array 42' as part of the memory access request 48 to avoid pre-charging bitlines 26 28 in the SRAM data array 46 during idle periods to reduce leakage power. But, by also providing the pre-charge circuit 66 in the second data access path 54' outside the first data access path 52', the pre-charge circuit 66 can enable pre-charging of the SRAM data array 42' prior to data access such that the pre-charge circuit 66 does not add latency to the first data access path 52'. As will be discussed in greater detail below, an optional self-timed clock circuit 100 is provided in the SRAM data array 46. The optional self-timed clock circuit 100 provides for an alternative means to assert or de-assert both the wordline signal 22 and/or the bitline pre-charge signal 38.

Figure 6:
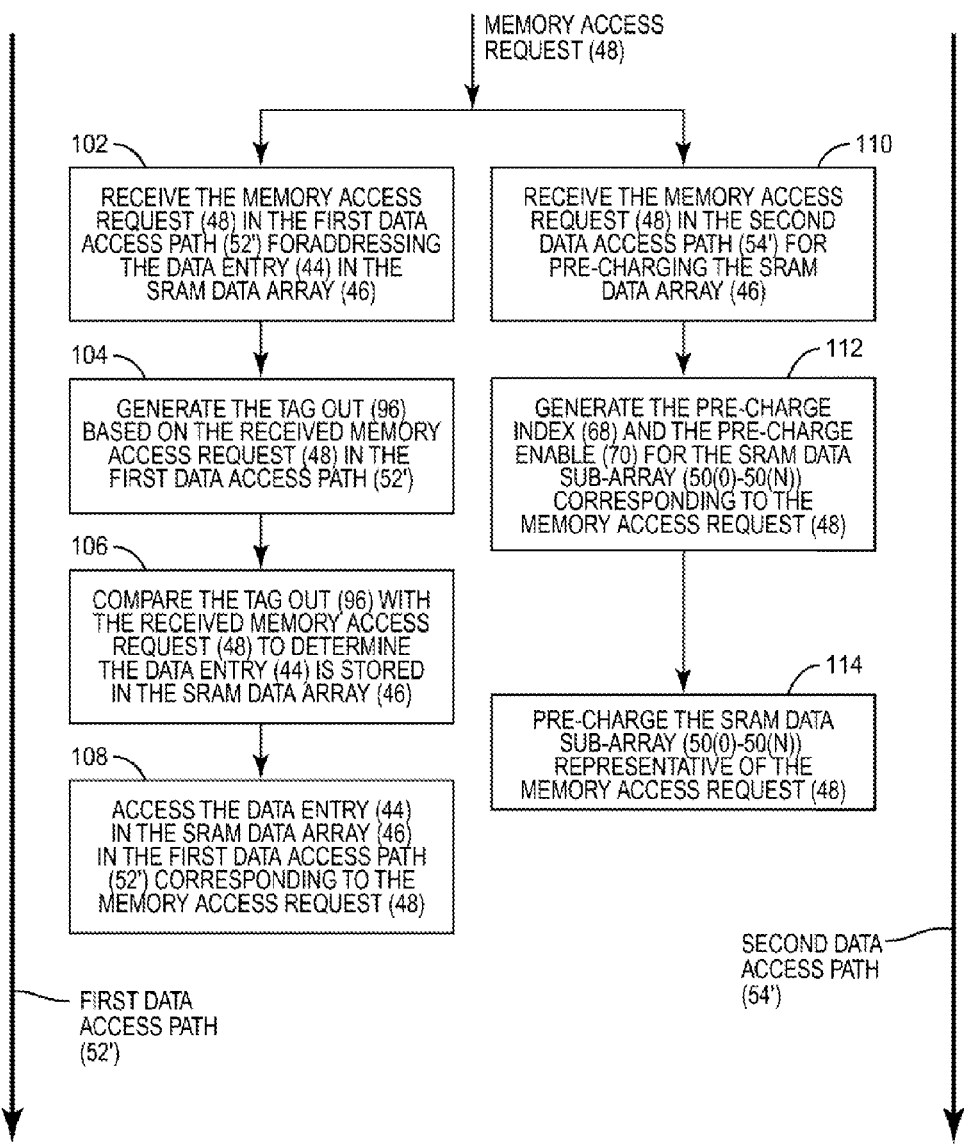
FIG. 6 is a flowchart illustrating an exemplary process for pre-charging bitlines in the SRAM data array in the SRAM cache in FIG. 5, prior to accessing the data entry in the SRAM data array for the memory access request.

To further explain a memory access request 48 and pre-charging of the SRAM data array 46 prior to data entry 44 access, FIG. 6 is provided. FIG. 6 is a flowchart illustrating an exemplary process for the processing of the memory access request 48 in the SRAM cache 42' of FIG. 5. The processing of the memory access request 48 comprises two (2) data access paths, the first data access path 52' and the second data access path 54'. The processing of the memory access request 48 for the data entry 44 in the SRAM data array 46 comprises receiving the memory access request 48 in the first data access path 52' for addressing the data entry 44 in the SRAM data array 46 (block 102). The memory access logic circuit 56' generates the tag out 96 based on the received memory access request 48 in the first data access path 52' (block 104). The comparator circuit 94 compares the tag out 96 with the received memory access request 48 to determine if the data entry 44 is stored in the SRAM data array 46 (block 106). The memory access logic circuit 56' generates the data index 60 and the array enable 62 based on the tag out 96 and the result of the comparison from the comparator circuit 94. The data index 60 and the array enable 62 generated by the memory access logic circuit 56' are output to the SRAM data array 46. The SRAM data array 46 uses the data index 60 and the array enable 62 received to access the data entry 44 in the SRAM data array 46 in the first data access path 52' corresponding to the memory access request 48 (block 108).

With continuing reference to FIG. 6, the processing of the memory access request 48 further comprises receiving the memory access request 48 in the second data access path 54' for pre-charging one or more of the SRAM data sub-arrays 50(0)-50(N). The memory access request 48 is received in the second data access path 54' for pre-charging bitlines 26 28 in the SRAM data array 46 by the pre-charge circuit 66 for pre-charging the SRAM data sub-array 50(0)-50(N) corresponding to the memory access request 48 (block 110). The pre-charge circuit 66 generates the pre-charge index 68 and the pre-charge enable 70 for the SRAM data sub-array 50(0)-50(N) corresponding to the memory access request 48 (block 112). The generated pre-charge index 68 and the pre-charge enable 70 are output by the pre-charge circuit 66 and received by the SRAM data array 46. The SRAM data array 46 uses the pre-charge index 68 and the pre-charge enable 70 received to pre-charge the SRAM data sub-array 50(0)-50(N) representative of the memory access request 48 (block 114). Thus, the SRAM data array 46 can pre-charge the SRAM data sub-array 50(0)-50(N) independently of the memory access logic circuit 56' generating the translation of the memory access request 48 in the first data access path 52'. In this manner, the SRAM data sub-array 50(0)-50(N) containing the data entry 44 corresponding to the memory access request 48 may be pre-charged prior to the SRAM data array 46 accessing the data entry 44 corresponding to the memory access request 48.

With continuing reference to FIG. 6, pre-charging occurs in the second data access path 54' outside of the first data access path 52' so that the pre-charging function is independent of data entry 44 access. By providing the pre-charge circuit 66 in the second data access path 54' outside of the first data access path 52', the pre-charge circuit 66 can enable pre-charging of the SRAM data sub-array 50(0)-50(N) independently of the data entry 44 access in the first data access path 52'. Thus, the pre-charge circuit 66 can enable the pre-charging of the SRAM data sub-array 50(0)-50(N) prior to the data entry 44 access in the SRAM data sub-array 50(0)-50(N) at the data entry address 58. To reduce or avoid leakage power during memory idle times, not all the bitlines 26 will be pre-charged. Thus, only the bitlines 26 and the bitline complements 28 of FIG. 1 of the SRAM data sub-array 50(0)-50(N) comprising the data entry 44 being accessed may be pre-charged, as opposed to all of the bitlines 26 and the bitline complements 28 in the SRAM data array 46, as a non-limiting example. The bitlines 26 and the bitline complements 28 of the SRAM data sub-arrays 50(0)-50(N) not being accessed as part of the memory access request 48 may be left in a floating state to further reduce leakage power. In this manner, latency of the pre-charge circuit 66 is not provided as part of the first data access path 52' for accessing the data entry 44 in the SRAM data sub-arrays 50(0)-50(N). The SRAM cache 42' can pre-charge the data entry 44 in the particular SRAM data sub-array 50(0)-50(N) being accessed, thus reducing leakage power in the SRAM cache 42'.

Figure 7:
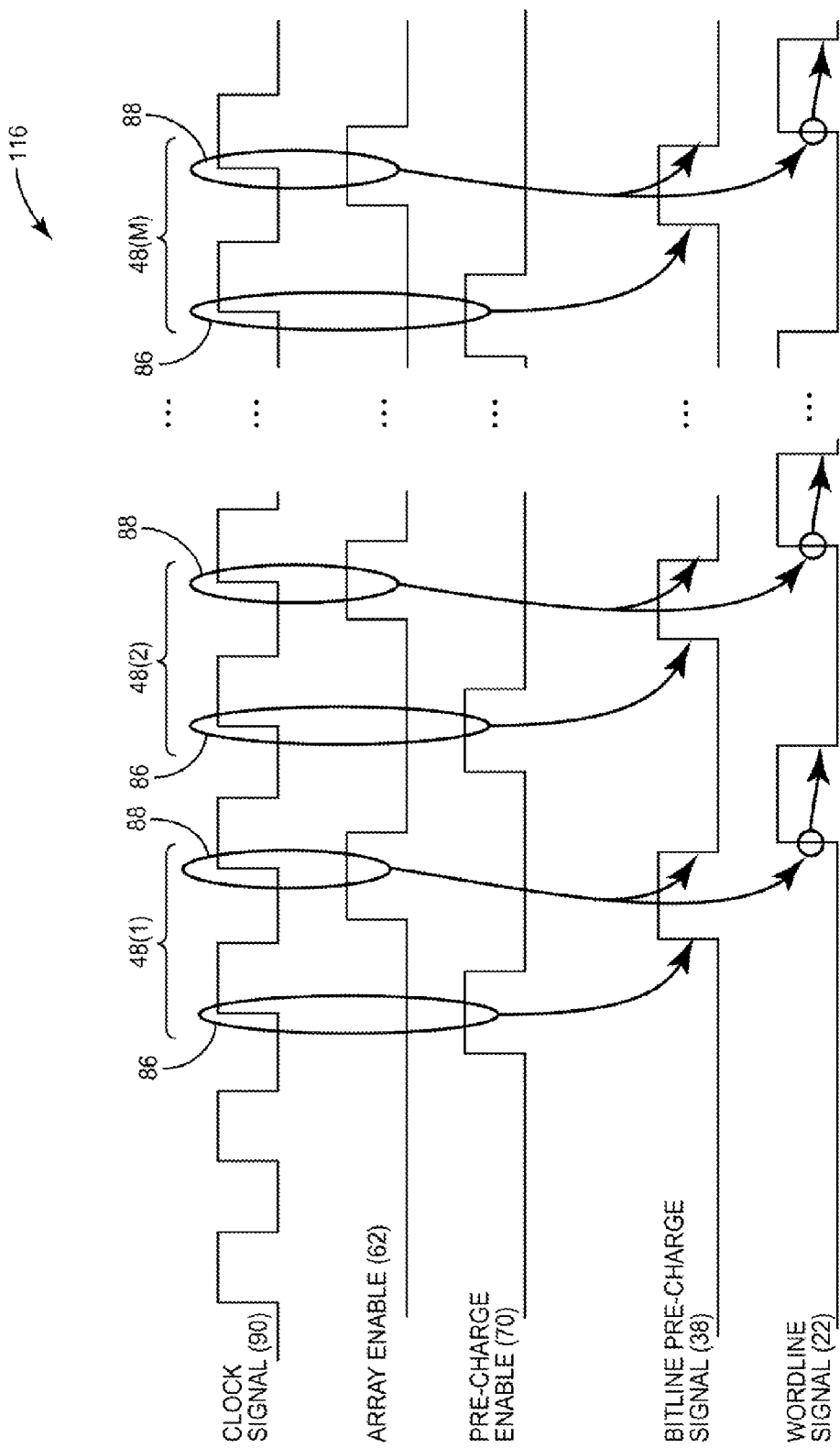
FIG. 7 is a timing diagram illustrating exemplary timing of signals involved in pre-charging bitlines in the SRAM data array in the SRAM cache in FIG. 5, prior to accessing the data entry in the SRAM data array for sequential memory access requests.

In this regard, a timing diagram 116 to illustrate the timing of exemplary signals involved with pre-charging and accessing the data entry 44 in the SRAM data sub-array 50(0)-50(N) corresponding to a received plurality of memory access requests 48(1)-48(M), FIG. 7 is provided. For the sake of clarity, elements referenced in FIG. 7 are described in FIGS. 1 and 2 and will not be re-described. FIG. 7 illustrates the pre-charging event 86 for enabling pre-charging bitlines 26 28 in the SRAM data array 46 in the second data access path 54 is independent of the accessing event 88 for accessing the SRAM data array 46 in the first data access path 52. Thus, the pre-charge enable 70 may be asserted prior to and separate from the array enable 62 being asserted. The processing of the memory access requests 48(1)-48(M) individually remains the same and will not be re-described.

With continuing reference to FIG. 7, the SRAM 42 may receive a plurality of memory access requests 48(1)-48(M). FIG. 7 illustrates the timing of signals for processing of a memory access request 48(1)-48(M) in the SRAM cache 42'. The processing of additional memory access requests 48 is the same as the processing of the memory access request 48 as described above in FIG. 6. The memory access request 48(2) in FIG. 7 is processed on a next rising clock edge of the clock signal 90 following the timing signals describing the memory access request 48(1).

Figure 8:
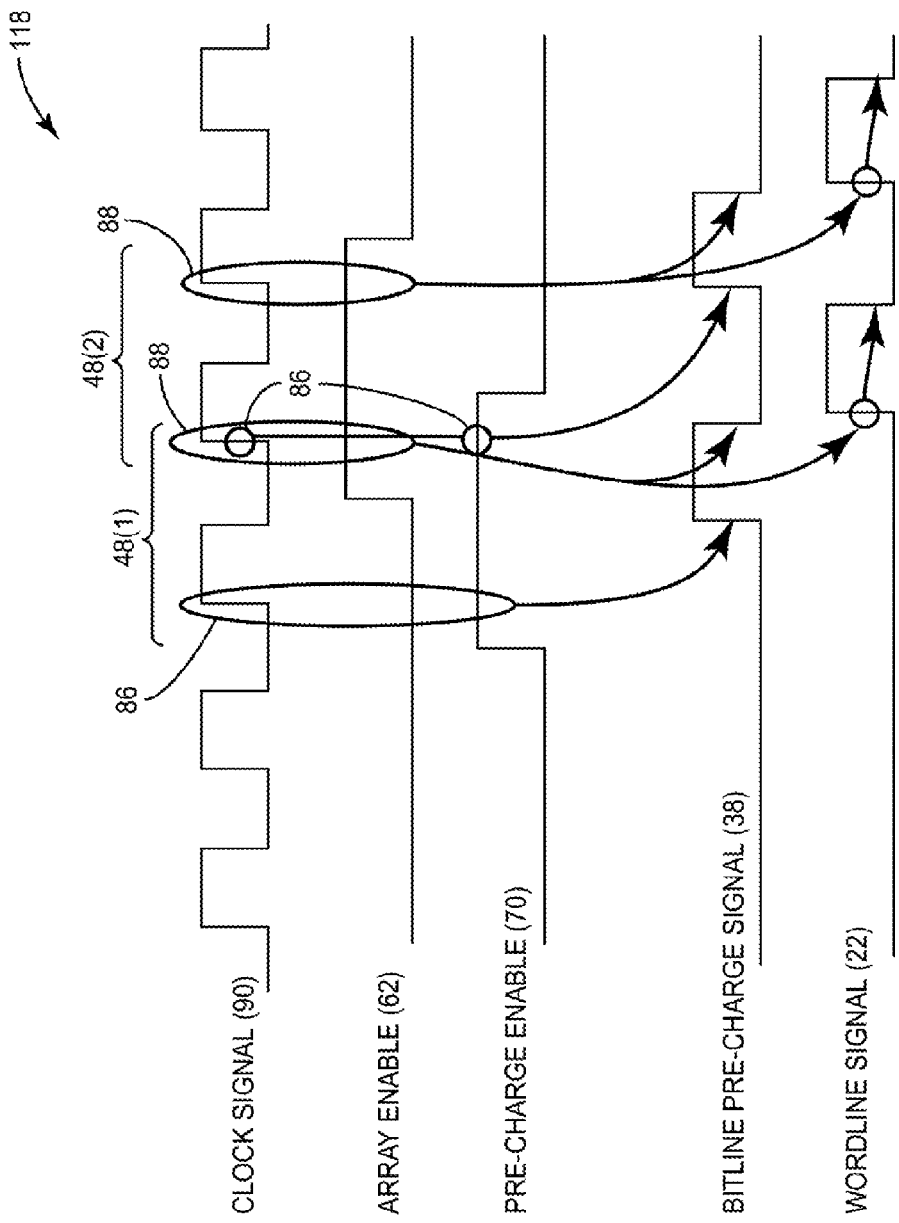
FIG. 8 is a timing diagram illustrating the exemplary timing of signals involved in pre-charging bitlines in the SRAM data array in the SRAM cache in FIG. 5, prior to accessing the data entry in the SRAM data array for pipelined sequential memory access requests.

FIG. 7 illustrates that the memory access requests 48(1)-48(M) are processed sequentially. To increase performance of the SRAM 42, the SRAM 42 may also process a plurality of memory access requests 48(1)-48(M) in a pipelined fashion. The processing of the memory access requests 48(1)-48(M) in a pipelined fashion allows for overlapped execution of the plurality of memory access requests 48(1)-48(M). In this regard, FIG. 8 illustrates a timing diagram 118 of exemplary signals involved with the pre-charging event 86 for enabling the pre-charging of the SRAM data array 46 and the accessing event 88 for accessing the data entry 44 in the SRAM data sub-array 50(0)-50(N) corresponding to two (2) received memory access requests 48(1), 48(2), similar to FIG. 7. However, FIG. 8 additionally illustrates the processing of the two (2) memory access requests 48(1), 48(2) in a pipelined fashion. The individual signals illustrated in FIG. 8 are shown in FIG. 2 and will not be re-described. The processing of each one of the two (2) memory access requests 48(1), 48(2) individually remains the same and will not be re-described. It should be noted that more than two (2) memory access requests 48(1), 48(2) may be received and processed. In this manner, FIG. 8 illustrates the pre-charging of the SRAM data array 46 for the memory access request 48(2) while the SRAM 42 is accessing the SRAM data array 46 corresponding to the memory access request 48(1).

With continuing reference to FIG. 8, the bitline pre-charge signal 38 is asserted a second time for the memory access request 48(2) by the SRAM data array 46. The bitline pre-charge signal 38 is asserted the second time based on the same rising edge of the clock signal 90 as the rising edge of the clock signal 90 used by the SRAM data array 46 to assert the wordline signal 22 for the memory access request 48(1). As discussed above, the rising edge of the clock signal 90 used by the SRAM data array 46 to assert the wordline signal 22 also de-asserts the bitline pre-charge signal 38 corresponding to the memory access request 48(1). The de-assertion of the bitline pre-charge signal 38 by the SRAM data array 46 corresponding to the memory access request 48(1) occurs so the bitline pre-charge signal 38 does not interfere with the accessing of the SRAM data array 46 by the memory access request 48(1) as described above in FIG. 4. However, in this example, the SRAM 42 uses the next rising edge of the clock signal 90 following the de-assertion of the wordline signal 22 by the SRAM data array 46 to re-assert the bitline pre-charge signal 38 by the SRAM data array 46. In this manner, the SRAM 42 avoids re-assertion of the bitline pre-charge signal 38 by the SRAM data array 46 while the wordline signal 22 is asserted by the SRAM data array 46, which may cause interference and erroneous results in the memory access request 48(1). Thus, the SRAM 42 may process the memory access request 48(1) and the memory access request 48(2) in a shorter time period by using a pipelined technique than would otherwise be possible in the sequential technique illustrated in FIG. 7. The SRAM 42 may be comprised of a plurality of SRAM data sub-arrays 50(0)-50(N) (not shown in FIG. 8). Each of the two (2) memory access requests 48(1), 48(2) in FIG. 8 may address the same or different data entries 44. Each of the data entries 44 may also be located in the same or different one of the plurality of SRAM data sub-arrays 50(0)-50(N).

Figure 9:
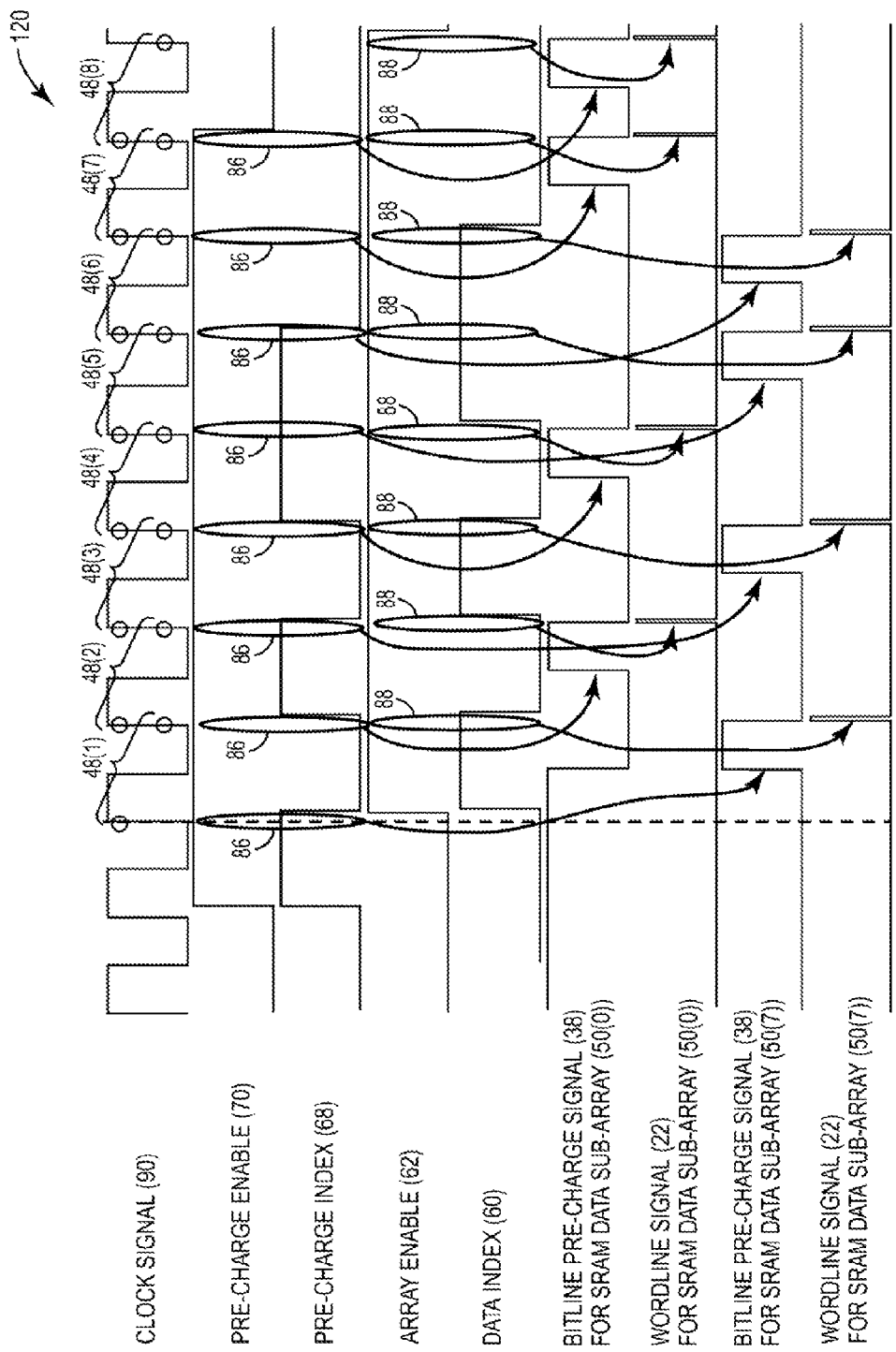
FIG. 9 is a timing diagram illustrating the exemplary timing of signals involved in pre-charging bitlines in the SRAM data array in the SRAM cache in FIG. 5, prior to accessing the data entry in the SRAM data array for pipelined sequential memory access requests including memory access requests for multiple banks of the SRAM cache.

In this regard, FIG. 9 is a timing diagram 120 illustrating exemplary signals involved with processing eight (8) memory access requests 48(1)-48(8) for addressing data entries 44 in a plurality of SRAM data sub-arrays 50(0)-50(N) in a pipelined fashion. The signals illustrated in FIG. 9 are shown in FIGS. 1 and 2 and will not be re-described. Similar to FIG. 8, the pre-charging event 86 for enabling the pre-charging of the SRAM data array 46 in the second data access path 54 is independent of the accessing event 88 for accessing the SRAM data array 46 in the first data access path 52. The processing of each one of the eight (8) memory access requests 48(1)-48(8) individually remains the same and will not be re-described. While FIG. 9 illustrates the processing of the plurality of memory access requests 48(1)-48(8) in a pipelined fashion similar to FIG. 8, FIG. 9 additionally illustrates the processing across a plurality of SRAM data sub-arrays 50(0)-50(N).

With continuing reference to FIG. 9, the pre-charge index 68 in FIG. 2 is provided to indicate which of the plurality of SRAM data sub-arrays 50(0)-50(N) will be pre-charged on a next rising edge of the clock signal 90, as a non-limiting example. The plurality of SRAM data sub-arrays 50(0)-50(N) may also be pre-charged on a falling edge of the clock signal 90 provided the pre-charging of the SRAM data sub-arrays 50(0)-50(N) is completed prior to memory access. In this example, the memory access request 48(1) is processed by the pre-charge circuit 66 (not shown) for accessing the data entry 44 corresponding to the data entry address 58 in the memory access request 48(1). The pre-charge circuit 66, in this non-limiting example, generates a pre-charge index 68 of 3 bits. A pre-charge index 68 of 3 bits allows for the pre-charge circuit 66 to identify one of a possible eight (8) SRAM data sub-arrays 50(0)-50(7) for pre-charging. In this example, the memory access request 48(1) comprises a data entry address 58 located in the SRAM data sub-array 50(7), thus the pre-charge index 68 has all bits asserted by the pre-charge circuit 66. The pre-charge index 68 of 3 bits with all bits asserted results in a binary value of "111" as the pre-charge index 68. Converting this binary value to a decimal value of "7" indicates the SRAM data sub-array 50(7) is to be pre-charged by the SRAM data array 46. With the pre-charge index 68 simultaneously provided, the pre-charge enable 70 is asserted by the pre-charge circuit 66. The pre-charge enable 70 indicates to the SRAM data array 46 that the pre-charge index 68 has been output by the pre-charge circuit 66. As described above, based on the assertion of the pre-charge enable 70, the SRAM data array 46 asserts the bitline pre-charge signal 38 activating the pre-charging for the SRAM data sub-array 50(7) on the next rising clock edge of the clock signal 90. In this example, each rising edge of the clock signal 90 may initiate an assertion of the bitline pre-charge signal 38 by the SRAM data array 46 in one of the plurality of SRAM data sub-arrays 50(0)-50(N).

With continued reference to FIG. 9, the assertion of the wordline signal 22 by the SRAM data array 46 corresponding to the SRAM data sub-array 50(0)-50(M) will both de-assert the bitline pre-charge signal 38 and activate access to the data entry 44 corresponding to the memory access request 48(1)-48(8). The wordline signal 22 may be de-asserted by the SRAM data array 46 based on several clocking schemes. In this example, each rising edge of the clock signal 90 may also initiate an assertion of the wordline signal 22 by the SRAM data array 46 in another one of the plurality of SRAM data sub-arrays 50(0)-50(N) simultaneously with the assertion of the bitline pre-charge signal 38 corresponding to a different memory access request 48 for a different SRAM data sub-array 50. The de-assertion of the wordline signal 22 may be performed by the SRAM data array 46 or by the optional self-timed clock circuit 100 (not shown) in a plurality of clocking schemes.

Figure 10:
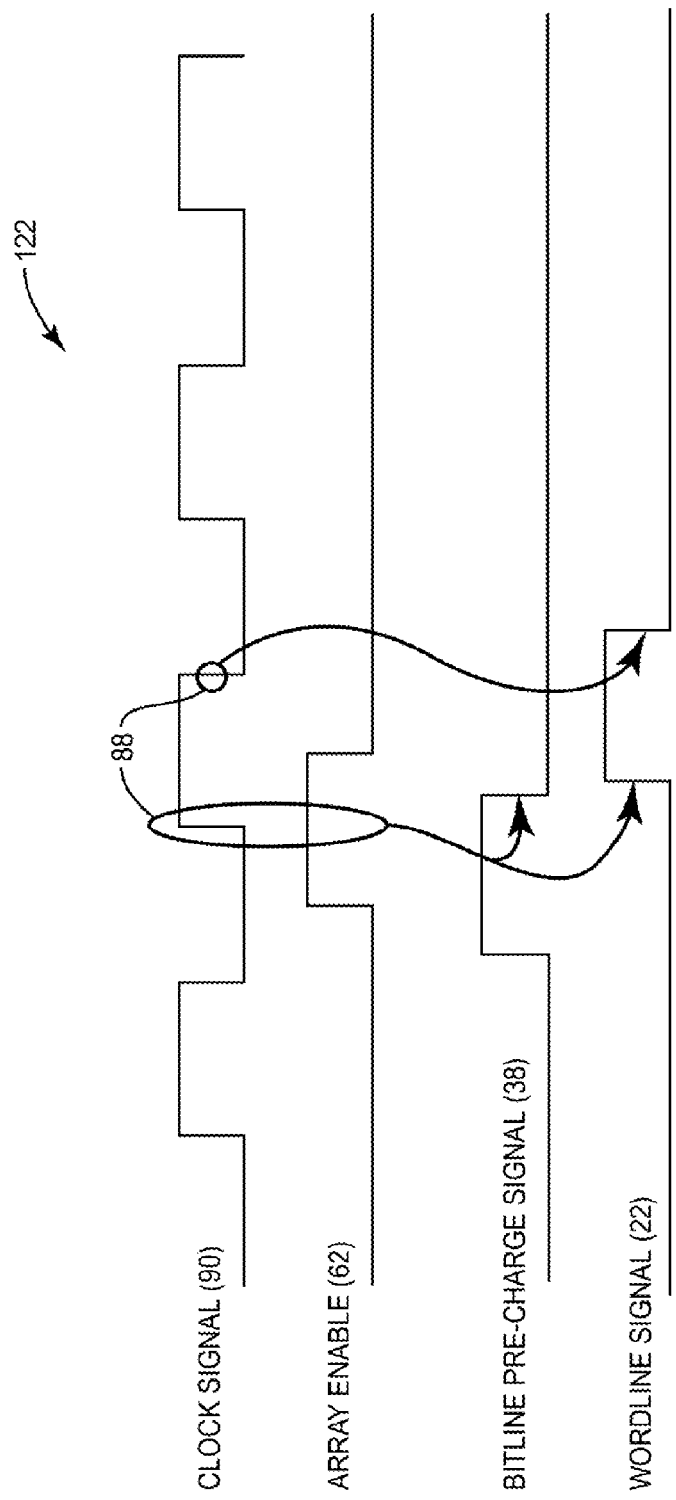
FIG. 10 is a timing diagram illustrating the exemplary timing of signals involved in pre-charging bitlines in the SRAM data array in the SRAM cache in FIG. 5, prior to accessing the data entry in the SRAM data array for controlling wordline assertion and pre-charging based on a clock phase control scheme.

In this regard, FIG. 10 is a timing diagram 122 illustrating the exemplary timing of signals for the accessing event 88 involving control of the wordline signal 22 assertion by the SRAM data array 46 based on the rising edge of the clock signal 90, called a phase-based clocking scheme. In this example, only the wordline signal 22 assertion by the SRAM data array 46 in the first data access path 52 of a single memory access request 48 is illustrated. The illustrated scheme for controlling the wordline signal 22 assertion by the SRAM data array 46 in FIG. 10 may be used in each of the timing examples described above. In the phase-based clocking scheme, with the array enable 62 asserted by the memory access logic circuit 56, the SRAM data array 46 will both assert the wordline signal 22 and de-assert the bitline pre-charge signal 38 on the same rising clock edge of the clock signal 90. The bitline pre-charge signal 38 is de-asserted by the SRAM data array 46 so as to not interfere with the accessing of the data entry 44 by the SRAM data array 46 as described above. The access to the SRAM data array 46 will remain activated until the de-assertion of the wordline signal 22 by the SRAM data array 46. The de-assertion of the wordline signal 22 by the SRAM data array 46 in the phase-based clocking scheme occurs on the next falling edge of the clock signal 90 following assertion of the wordline signal 22. The bitline pre-charge signal 38 is de-asserted by the SRAM data array 46 as the wordline signal 22 is asserted by the SRAM data array 46, and the bitline pre-charge signal 38 may remain in the de-asserted state, otherwise called a floating state, until the next memory access request 48. The phase-based clocking scheme allows the falling edge of the clock signal 90 to control or direct the SRAM data array 46 to de-assert the wordline signal 22.

Figure 11:
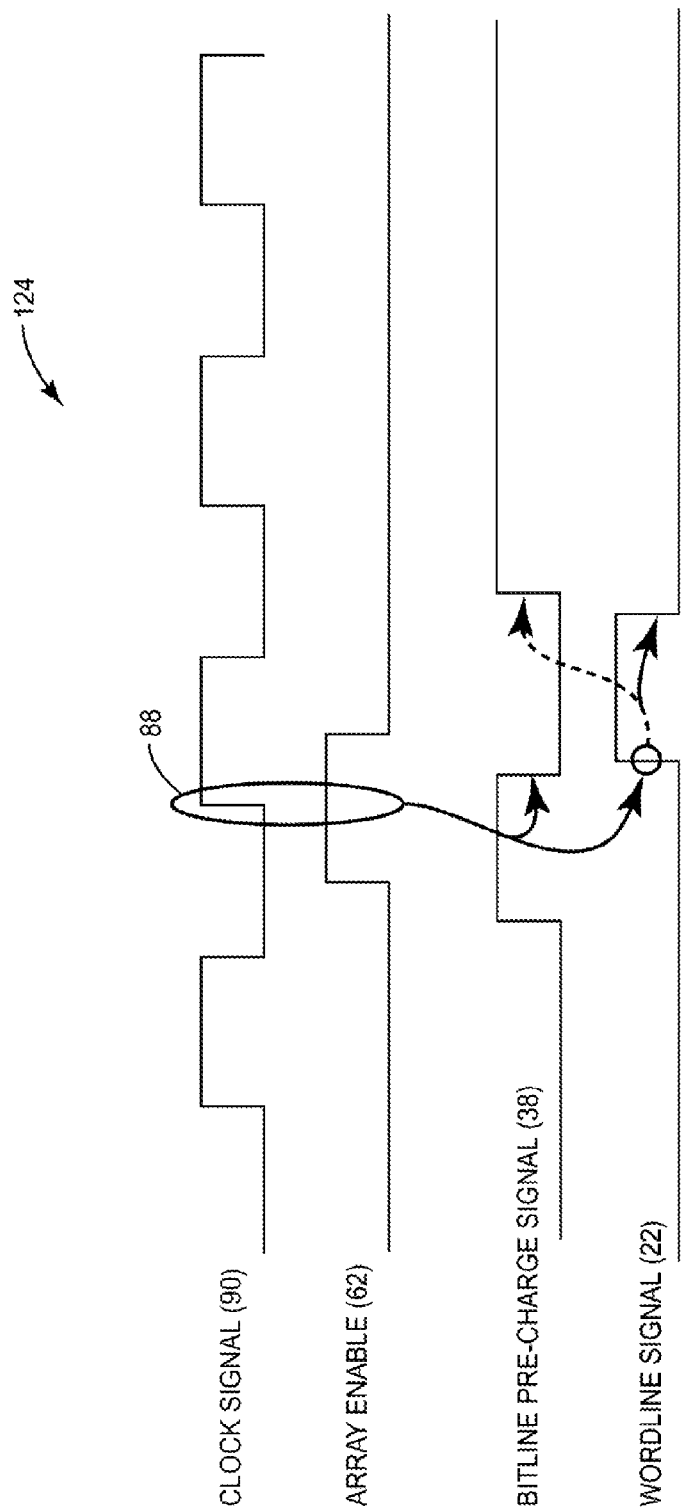
FIG. 11 is a timing diagram illustrating the exemplary timing of signals involved in pre-charging bitlines in the SRAM data array in the SRAM cache in FIG. 5, prior to accessing the data entry in the SRAM data array for controlling wordline assertion and pre-charging based on an optional self-timed control scheme.

In designs where the clock signal 90 operates at frequencies faster than specified for operation of the SRAM 42, it is possible that the SRAM data array 46 may control the wordline signal 22 independently of the falling edge of the clock signal 90. In this regard, FIG. 11 is a timing diagram 124 illustrating the exemplary timing of signals for the accessing event 88 involving control of the wordline signal 22 assertion by the SRAM data array 46 based on an optional self-timed control scheme. The illustrated technique for controlling wordline signal 22 assertion by the SRAM data array in FIG. 11 may be used in each of the timing examples described above. In the optional self-timed control scheme, the SRAM data array 46 uses the optional self-timed clock circuit 100 (not shown) in FIG. 5 to de-assert the wordline signal 22 and re-assert the bitline pre-charge signal 38 based on a pre-set or otherwise programmed value. The optional self-timed clock circuit 100 is activated by the SRAM data array 46 with the assertion of the wordline signal 22 by the SRAM data array 46. The optional self-timed clock circuit 100 allows for enough time to properly access the data entry 44 in the SRAM data array 46 before de-asserting the wordline signal 22. The optional self-timed clock circuit 100 will optionally re-assert the bitline pre-charge signal 38 by the SRAM data array 46 if a subsequent memory access request 48 is requesting access to the SRAM data array 46. The optional self-timed clock circuit 100 may be provided where the clock signal 90 frequency is too fast to ensure adequate time to access the data entry 44 in the SRAM data array 46 corresponding to the memory access request 48.

Figure 12:
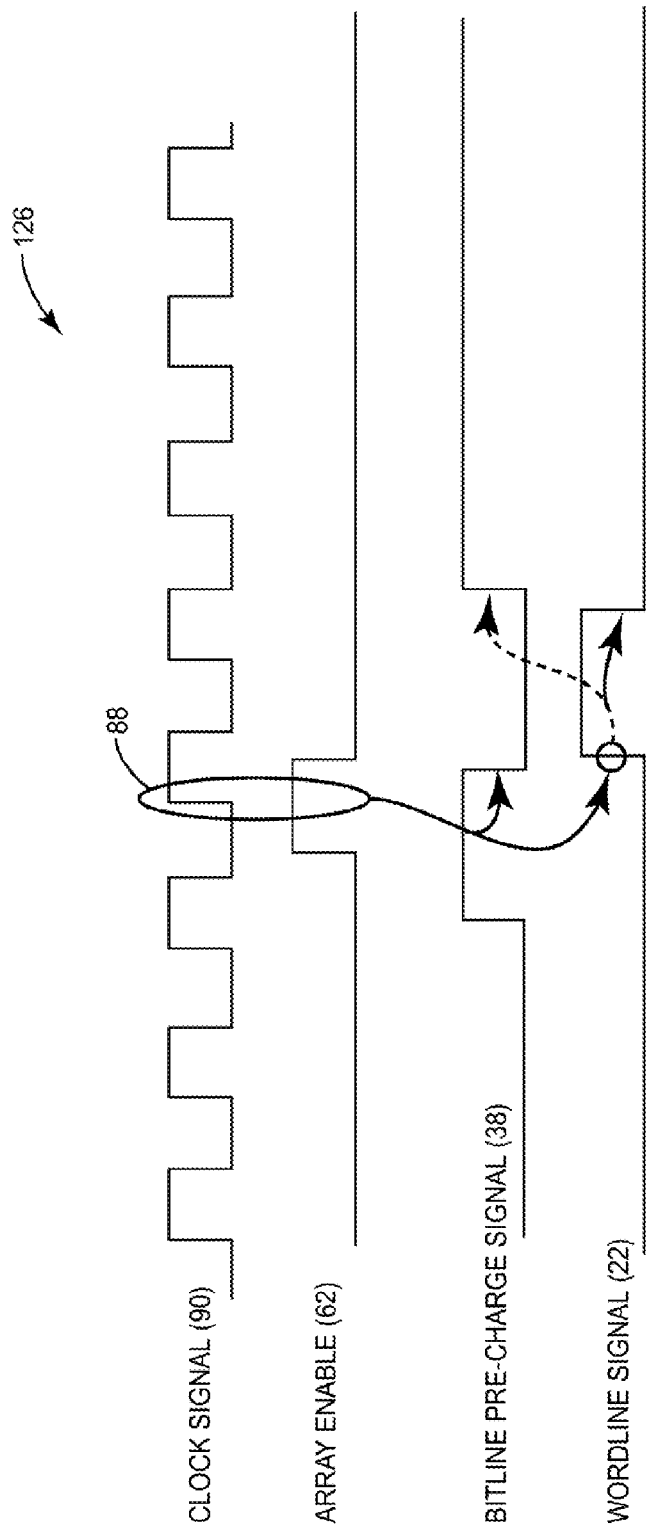
FIG. 12 is a timing diagram illustrating the exemplary timing of signals involved in pre-charging bitlines in the SRAM data array in the SRAM cache in FIG. 5, prior to accessing the data entry in the SRAM data array for controlling wordline assertion and pre-charging based on an optional self-timed, self-resetting control scheme across multiple clock cycles.

It may also be desired to provide for clock signal 90 frequencies involving clock periods that are shorter than the total time necessary to both access the data entry 44 in the SRAM data array 46 and to re-assert the bitline pre-charge signal 38 by the SRAM data array 46. In this regard FIG. 12 is a timing diagram 126 illustrating the exemplary timing of signals for the accessing event 88 involving control of the wordline signal 22 assertion by the SRAM data array 46 based on an optional self-timed, self-resetting control scheme across multiple clock cycles. The illustrated scheme for controlling wordline signal 22 assertion by the SRAM data array 46 in FIG. 12 may be used in each of the timing examples described above. In the optional self-timed, self-resetting control scheme, the SRAM data array 46 uses the optional self-timed clock circuit 100 (not shown) in FIG. 5 to de-assert the wordline signal 22 based on a pre-set or programmed value, and to optionally re-assert the bitline pre-charge signal 38. The optional self-timed, self-resetting control scheme may be provided where the optional self-timed clock circuit 100 is not be able to reset fast enough to allow for a subsequent memory access request 48 in the SRAM data array 46. This may include timing scenarios in which access by the SRAM data array 46 occurs across multiple clock cycles, and the clock period is not long enough to ensure adequate time to access the data entry 44 in the SRAM data array 46 corresponding to the memory access request 48. It should be noted that similar to the self-clocking scheme described above, there should be enough time allowed to access the SRAM data array 46 and also pre-charge the bitline 26 and the bitline complement 28 from one access to the next. However, the optional self-timed, self-resetting clock scheme is a scheme whereby the optional self-timed clock circuit 100 resets itself when the SRAM data array 46 de-asserts the wordline signal 22 and re-asserts the bitline pre-charge signal 38 in preparation for a subsequent memory access request 48. The optional self-timed clock circuit 100 resets itself, as opposed to the optional self-timed clock circuit 100 being reset by the SRAM data array 46.

Pre-charging bitlines in a SRAM prior to data access for reducing leakage power, and related systems and methods, according to embodiments disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 13:
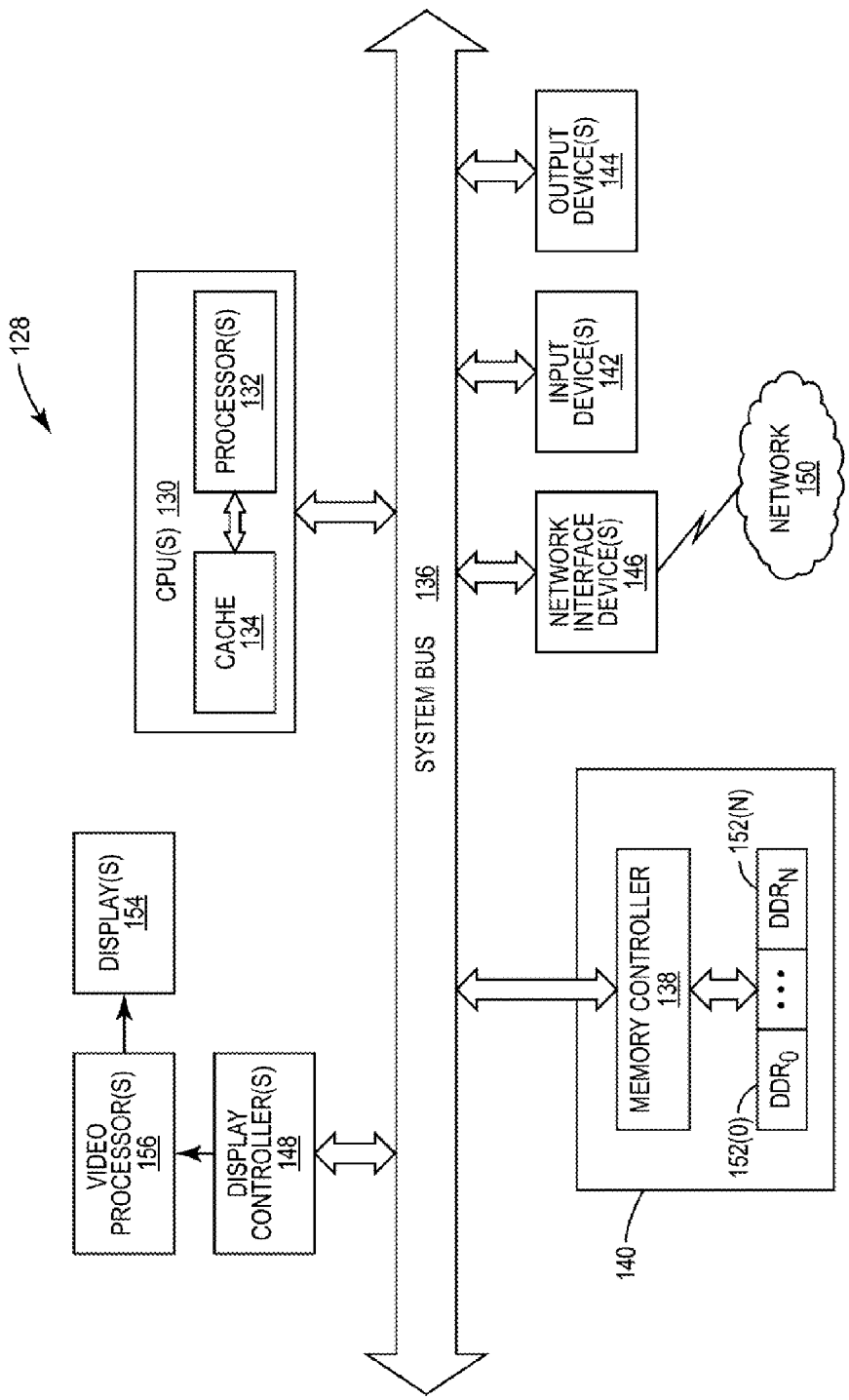
FIG. 13 is a block diagram of an exemplary processor-based system comprising the generalized memory access logic circuit and the pre-charge circuit of the SRAM of FIG. 2 and the SRAM cache of FIG. 5.

In this regard, FIG. 13 illustrates an example of a processor-based system 128 that can employ the systems and methods for pre-charging of a SRAM data array prior to data entry access for reducing leakage power in the SRAM 42 and the SRAM 42' disclosed herein. In this example, the processor-based system 128 includes one or more CPUs 130, each including one or more processors 132. The CPU(s) 130 may have cache memory 134 coupled to the processor(s) 132 for rapid access to temporarily stored data. The CPU(s) 130 is coupled to a system bus 136 and can intercouple master and slave devices included in the processor-based system 128. As is well known, the CPU(s) 130 communicates with these other devices by exchanging address, control, and data information over the system bus 136. For example, the CPU(s) 130 can communicate bus transaction requests to a memory controller 138 as an example of a slave device. Although not illustrated in FIG. 13, multiple system buses 136 could be provided, wherein each system bus 136 constitutes a different fabric.

Other master and slave devices can be connected to the system bus 136. As illustrated in FIG. 13, these devices can include a memory system 140, one or more input devices 142, one or more output devices 144, one or more network interface devices 146, and one or more display controllers 148, as examples. The input device(s) 142 can include any type of input device, including but not limited to input keys, switches, voice processors, etc. The output device(s) 144 can include any type of output device, including but not limited to audio, video, other visual indicators, etc. The network interface device(s) 146 can be any devices configured to allow exchange of data to and from a network 150. The network 150 can be any type of network, including but not limited to a wired or wireless network, a private or public network, a local area network (LAN), a wide local area network (WLAN), and the Internet. The network interface device(s) 146 can be configured to support any type of communication protocol desired. The memory system 140 can include one or more memory units 152(0-N).

The CPU(s) 130 may also be configured to access the display controller(s) 148 over the system bus 136 to control information sent to one or more displays 154. The display controller(s) 148 sends information to the display(s) 154 to be displayed via one or more video processors 156, which process the information to be displayed into a format suitable for the display(s) 154. The display(s) 154 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The master devices, and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A static random access memory (SRAM) comprising:
a memory access logic circuit provided in a first data access path, the memory access logic circuit configured to:
receive a data entry address of a memory access request for addressing a data entry in a SRAM data array in the first data access path; and
generate a data index based on the received data entry address in the first data access path to index the SRAM data array for accessing the data entry in the SRAM data array corresponding to the received data entry address; and
a pre-charge circuit provided in a second data access path separate from the first data access path, the pre-charge circuit configured to, prior to accessing the data entry in the SRAM data array:
receive the data entry address in the second data access path; and
generate a pre-charge enable to at least a portion of the SRAM data array based on the received data entry address in the second data access path to pre-charge the at least a portion of the SRAM data array.

2. The SRAM of claim 1, wherein the SRAM data array comprises a plurality of SRAM data sub-arrays.

3. The SRAM of claim 2, wherein the pre-charge circuit is configured to generate the pre-charge enable for each of the plurality of SRAM data sub-arrays based on the received data entry address.

4. The SRAM of claim 2, wherein the pre-charge circuit is configured to generate a pre-charge index as an output indicative of a SRAM data sub-array location from the plurality of SRAM data sub-arrays based on the received data entry address.

5. The SRAM of claim 1, configured to disable a bitline pre-charge signal for the SRAM data array based on asserting a wordline signal.

6. The SRAM of claim 1, wherein the memory access logic circuit further comprises a tag array to index the data entry based on the received data entry address.

7. The SRAM of claim 6, wherein the SRAM data array comprises a plurality of SRAM data sub-arrays.

8. The SRAM of claim 6, wherein the pre-charge circuit is configured to generate the pre-charge enable for each of a plurality of SRAM data sub-arrays based on the received data entry address.

9. The SRAM of claim 6, wherein the pre-charge circuit is configured to generate a pre-charge index as an output indicative of a SRAM data sub-array location from a plurality of SRAM data sub-arrays based on the received data entry address.

10. The SRAM of claim 6, configured to disable a bitline pre-charge signal for the SRAM data array based on asserting a wordline signal.

11. The SRAM of claim 6, configured to generate a bitline pre-charge signal upon an assertion of the pre-charge enable and a clock signal for the memory access request.

12. The SRAM of claim 11, wherein the pre-charge circuit is configured to receive a data entry address for a second memory access request as a second input for addressing a second data entry in the SRAM data array in the first data access path, while generating a pre-charge index as an output in the second data access path to the at least a portion of the SRAM data array based on the received data entry address for a first memory access request in the second data access path to pre-charge the SRAM data array.

13. The SRAM of claim 12, wherein the pre-charge circuit is configured to generate the pre-charge enable for the second memory access request to the at least a portion of the SRAM data array based on the received data entry address for the second memory access request in the second data access path to pre-charge the at least a portion of the SRAM data array, while generating the bitline pre-charge signal upon the assertion of the pre-charge enable and the clock signal for the memory access request.

14. The SRAM of claim 6 integrated into an integrated circuit.

15. The SRAM of claim 6 integrated into a device selected from the group consisting of a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

16. The SRAM of claim 1, configured to generate a bitline pre-charge signal upon an assertion of the pre-charge enable and a clock signal for the memory access request.

17. The SRAM of claim 16, wherein the pre-charge circuit is configured to receive a data entry address for a second memory access request as a second input for addressing a second data entry in the SRAM data array in the first data access path, while generating a pre-charge index as an output in the second data access path to the at least a portion of the SRAM data array based on the received data entry address for a first memory access request in the second data access path to pre-charge the SRAM data array.

18. The SRAM of claim 17, wherein the pre-charge circuit is configured to generate the pre-charge enable for the second memory access request to the at least a portion of the SRAM data array based on the received data entry address for the second memory access request in the second data access path to pre-charge the at least a portion of the SRAM data array, while generating the bitline pre-charge signal upon the assertion of the pre-charge enable and the clock signal for the memory access request.

19. The SRAM of claim 1 integrated into an integrated circuit.

20. The SRAM of claim 1 integrated into a device selected from the group consisting of a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

21. A static random access memory (SRAM) comprising:
a memory access logic circuit means provided in a first data access path means, the memory access logic circuit means configured to:
  receive a data entry address means for a memory access request means for addressing a data entry means in a SRAM data array means in the first data access path means; and
  generate a data index means based on the received data entry address means in the first data access path means to index the SRAM data array means for accessing the data entry means in the SRAM data array means corresponding to the data entry address means; and a pre-charge circuit means provided in a second data access path means separate from the first data access path means, the pre-charge circuit means configured to, prior to accessing the data entry means in the SRAM data array means:
  receive the data entry address means in the second data access path means; and
  generate a pre-charge enable means to at least a portion of the SRAM data array means based on the received data entry address means in the second data access path means to pre-charge the at least a portion of the SRAM data array means.

22. A method of pre-charging a static random access memory (SRAM) data array prior to accessing the SRAM data array, comprising:
receiving a data entry address in a first data access path for a memory access request for addressing a data entry in a SRAM data array;
generating a data index based on the received data entry address in the first data access path to index the SRAM data array for accessing the data entry in the SRAM data array corresponding to the data entry address;
receiving a data entry address in a second data access path for pre-charging at least a portion of the SRAM data array; and
generating a pre-charge enable for the at least a portion of the SRAM data array based on the received data entry address in the second data access path to pre-charge the at least a portion of the SRAM data array, wherein the pre-charge enable is generated prior to accessing the data entry in the SRAM data array in the first data access path at the data index representative of the data entry address.

23. The method of claim 22, further comprising generating a bitline pre-charge signal for the memory access request for the at least a portion of the SRAM data array based on the received data entry address in the second data access path, wherein the bitline pre-charge signal is generated prior to accessing the data entry in the SRAM data array in the first data access path at the data index representative of the data entry address.

24. The method of claim 22, comprising receiving the data entry address in the first data access path for the memory access request for addressing the data entry in the SRAM data array, wherein the SRAM data array comprises a plurality of SRAM data sub-arrays.

25. The method of claim 22, configured to generate a bitline pre-charge signal based upon an assertion of the pre-charge enable and a clock signal for the memory access request.

26. The method of claim 25, further comprising receiving the data entry address for a second memory access request as a second input for addressing a second data entry in the second data access path for pre-charging the at least a portion of the SRAM data array, while generating the pre-charge enable for the at least a portion of the SRAM data array, based on the received data entry address for a first memory access request in the second data access path to pre-charge the at least a portion of the SRAM data array.

27. The method of claim 26, further comprising generating the pre-charge enable for the second memory access request for the at least a portion of the SRAM data array based on the received data entry address in the second data access path to pre-charge the at least a portion of the SRAM data array, while generating the bitline pre-charge signal based upon the assertion of the pre-charge enable and the clock signal for the first memory access request.

28. The method of claim 22, wherein generating the data index in the first data access path for indexing the data entry in the SRAM data array further comprises receiving the data index by a tag array to index the data entry based on the received data index.

29. The method of claim 22, wherein generating a bitline pre-charge signal is based upon an assertion of the pre-charge enable and an assertion of a clock signal.

30. The method of claim 29, wherein generating the bitline pre-charge signal is disabled based upon an assertion of an array enable and the assertion of the clock signal.

\* \* \* \* \*